(12) United States Patent  
Shroff

(10) Patent No.: US 8,202,778 B2  
(45) Date of Patent: Jun. 19, 2012

(54) PATTERNING A GATE STACK OF A NON-VOLATILE MEMORY (NVM) WITH SIMULTANEOUS ETCH IN NON-NVM AREA

(75) Inventor: Mehul D. Shroff, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 109 days.

(21) Appl. No.: 12/872,073

(22) Filed: Aug. 31, 2010

(65) Prior Publication Data

US 2012/0052670 A1    Mar. 1, 2012

(51) Int. Cl.
*H01L 21/336* (2006.01)
*H01L 21/4763* (2006.01)
*H01L 21/3205* (2006.01)

(52) U.S. Cl. ......... 438/257; 438/267; 438/591; 438/593

(58) Field of Classification Search .................. 438/257, 438/267, 591, 593
See application file for complete search history.

(56) References Cited

U.S. PATENT DOCUMENTS

| | | | | |
|---|---|---|---|---|
| 6,881,994 | B2 * | 4/2005 | Lee et al. | 257/296 |
| 7,439,134 | B1 * | 10/2008 | Prinz et al. | 438/258 |
| 2010/0244120 | A1 * | 9/2010 | Kang et al. | 257/325 |
| 2010/0248466 | A1 * | 9/2010 | Loiko et al. | 438/593 |

* cited by examiner

*Primary Examiner* — Luan C Thai

(74) *Attorney, Agent, or Firm* — James L. Clingan, Jr.; Joanna G. Chiu

(57) ABSTRACT

Forming a gate stack of a non-volatile memory (NVM) over a substrate having an NVM region and non-NVM region which does not overlap the NVM region includes forming a select gate layer over the substrate in the NVM and non-NVM regions; simultaneously etching the select gate layer in the NVM and non-NVM regions; forming a charge storage layer over the substrate in the NVM and non-NVM regions; forming a control gate layer over the charge storage layer in the NVM and non-NVM regions; and simultaneously etching the charge storage layer in the NVM and the non-NVM regions. Etching the select gate layer in the NVM region results in a portion of the charge storage layer over a portion of the select gate layer and overlapping a sidewall of the select gate layer and results in a portion of the control gate layer over the portion of the charge storage layer.

20 Claims, 22 Drawing Sheets

PATTERNING A GATE STACK OF A NON-VOLATILE MEMORY (NVM) WITH SIMULTANEOUS ETCH IN NON-NVM AREA

CROSS-REFERENCE TO RELATED APPLICATION

This application is related to U.S. patent application Ser. No. 12/872,070, filed on even date, titled "PATTERNING A GATE STACK OF A NON-VOLATILE MEMORY (NVM) USING A DUMMY GATE STACK," naming Mehul Shroff as inventor, and assigned to the current assignee hereof.

BACKGROUND

1. Field

This disclosure relates generally to non-volatile memories (NVMs), and more specifically, to patterning gate stacks of the NVMs.

2. Related Art

Gate stacks of NVM bitcells often include two layers of conductive material and one of those conductive layers is also used for forming logic circuits or other circuits. One of the objectives is to not use any more mask steps than necessary; the fewer the better. Another consideration is that etches vary in their selectivity and that for the gate stack in particular it is desirable to have nearly vertical sidewalls. The etchants with the best selectivity may not be the best for obtaining vertical sidewalls. For some etches end point detection is very important. This can arise because of selectivity issues so that an over etch is a limited option. Further, an over etch can result in undesirable polymers being left behind.

FIGS. 30-32 illustrate cross-sectional views of various stages during the formation of an integrated circuit having an NVM region and a tile region, in accordance with the prior art. Referring to FIG. 1, a first polysilicon layer is formed over the substrate in both the NVM region and the tile region. The first polysilicon layer is patterned such that a portion remains between the isolation regions in each of the NVM and tile regions. Subsequently, a dielectric layer is formed over the first polysilicon layer in both the NVM and tile regions, and a second polysilicon layer is formed over the dielectric layer in both the NVM and tile regions. In FIG. 2, a photoresist layer is formed over the second polysilicon layer and patterned, wherein the remaining portions of the photoresist layer correspond to a gate stack in the NVM region and a tile feature in the tile region. Each of the first polysilicon layer, dielectric layer, and the second dielectric layer is simultaneously etched, using the patterned photoresist layer, in the NVM region and the tile region. Therefore, referring to FIG. 3, the simultaneous etching in the NVM region and the tile region result in the formation of a gate stack in the NVM region having a portion of the first polysilicon layer and the second polysilicon layer and a tile feature in the tile region having both a portion of the first polysilicon layer and the second polysilicon layer. The tile feature in the tile region is formed over the substrate, between the isolation regions and not on the isolation regions. The simultaneous etching of the tile feature in the tile region at the same time as the gate stack in the NVM region provides additional material for use in end point detection during the gate stack etch. Note that the resulting tile feature is not electrically active. Accordingly, it is desirable to provide the patterning of a gate stack of an NVM that takes into account the above issues to result in improved patterning.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a sacrificial region that includes a dummy gate stack is created in an area different from a region where the non-volatile memory (NVM) array is located. The dummy gate stack may be used to simulate an actual NVM gate stack used in the NVM array. During an etch of the NVM gate stack, the dummy gate stack is also etched so that the end of both the stack etches occur at the same time. This may or may not be a patterned etch so the dummy gate stack may or may not have a portion remaining after the etch. This allows for improved end point detection of the NVM gate stack etch due to increased endpoint material being exposed at the end of the etch. Also other tiling features may be left remaining after the etch of the dummy gate stack with a patterned etch. This is better understood by reference to the drawings and the following description.

Figure 1:
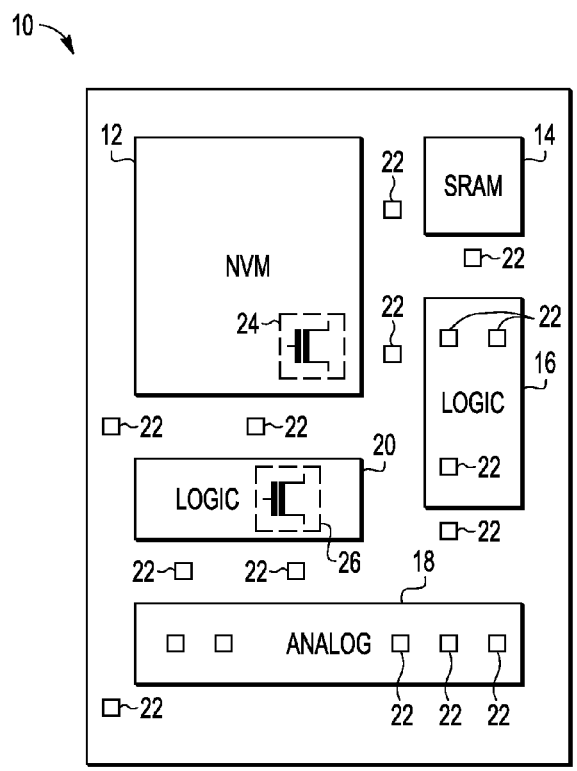
FIG. 1 is a top view of an integrated circuit including a non-volatile memory (NVM) and other circuitry.

Shown in FIG. 1 is a top view of an integrated circuit 10 having an NVM array 12, an SRAM array 14, a logic circuit 16, an analog circuit 18, a logic circuit 20, and a plurality of dummy gate stacks 22. Dummy gate stacks 22 may be between the circuit blocks or within the circuit blocks. An exemplary dummy gate stack 26 is shown in logic circuit 20. Similarly, an exemplary NVM gate stack 24 is shown in NVM array 12.

Figure 2:
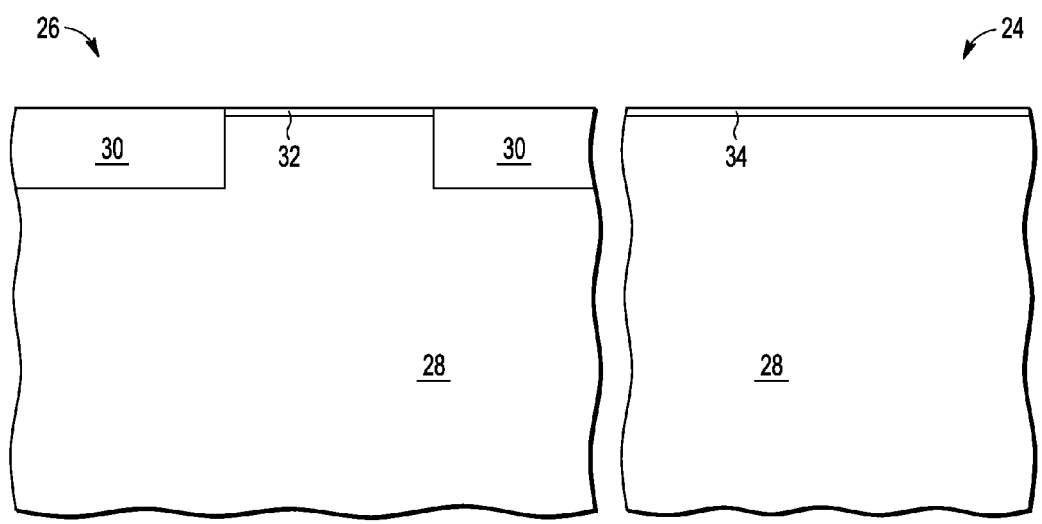
FIG. 2 is a cross section of two different portions of the integrated circuit of FIG>. 1 at a stage in processing according to a first embodiment.

Shown in FIG. 2 are NVM gate stack 24 and dummy gate stack 26 in cross section form at an early stage in processing. Included in FIG. 2 is a substrate 28 that may be silicon, an isolation region 30, which may be a shallow trench isolation (STI) region, surrounding an active region for dummy gate stack 26, a dummy dielectric 32 formed on the active region surrounded by isolation region 30, and a gate dielectric 34 for NVM gate stack 24.

Figure 3:
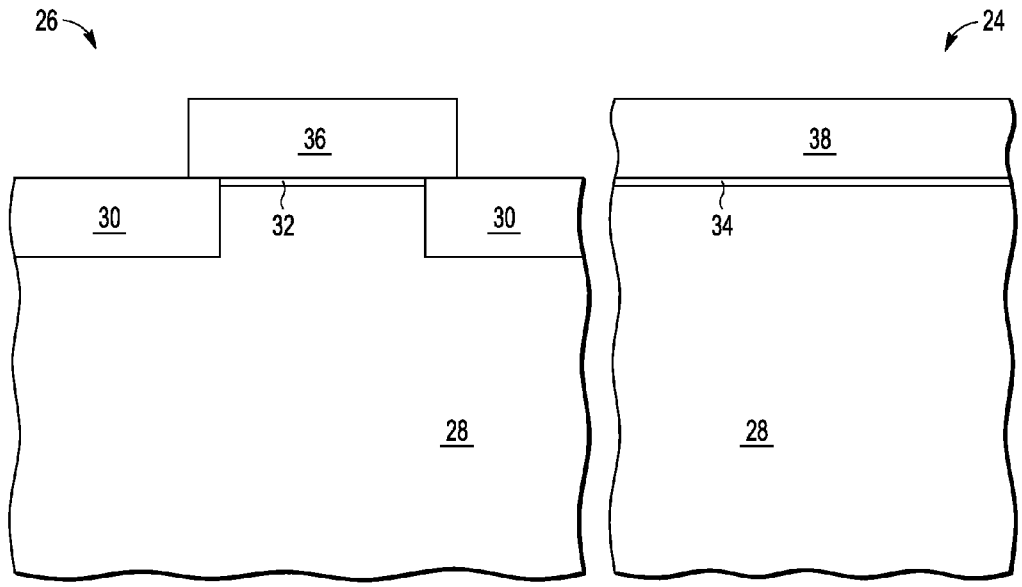
FIG. 3 is a cross section of the two the different portions shown in FIG. 2 at a subsequent stage in processing.

Shown in FIG. 3 are NVM gate stack 24 and dummy gate stack 26 after depositing a conductive layer and patterning it to form a conductive layer 36 and forming conductive layer 38. Conductive layers 36 and 38 may be polysilicon. Conductive layers 36 and 38 may thus be formed by a polysilicon deposition followed by a patterned etch.

Figure 4:
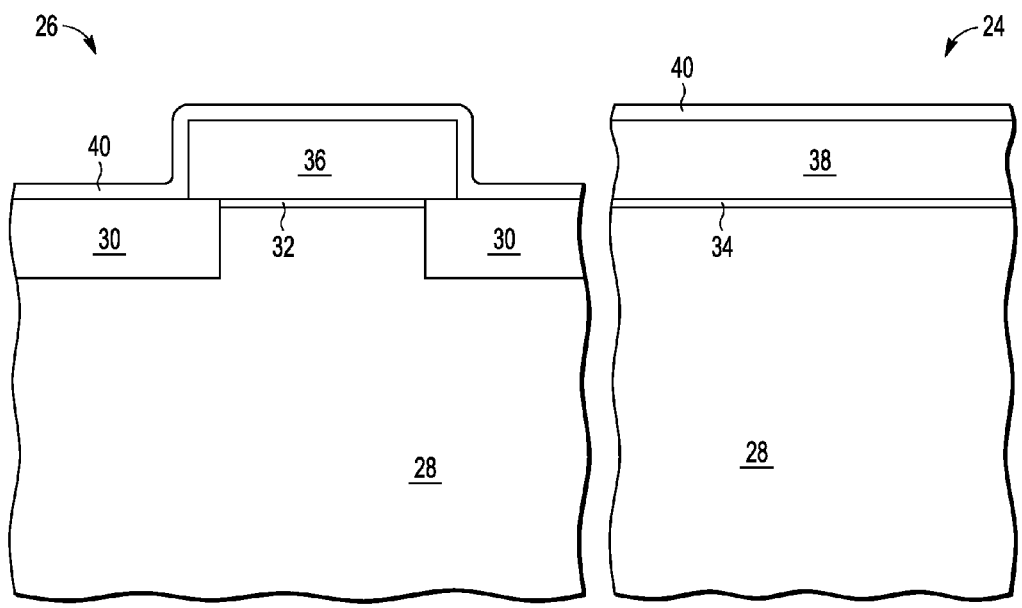
FIG. 4 is a cross section of the two the different portions shown in FIG. 3 at a subsequent stage in processing.

Shown in FIG. 4 are NVM gate stack 24 and dummy gate stack 26 after depositing a dielectric layer 40 that may be achieved by sequentially depositing oxide, then nitride, and then oxide. This type of layer may be referenced as an ONO layer. Other dielectrics may also be effective.

Figure 5:
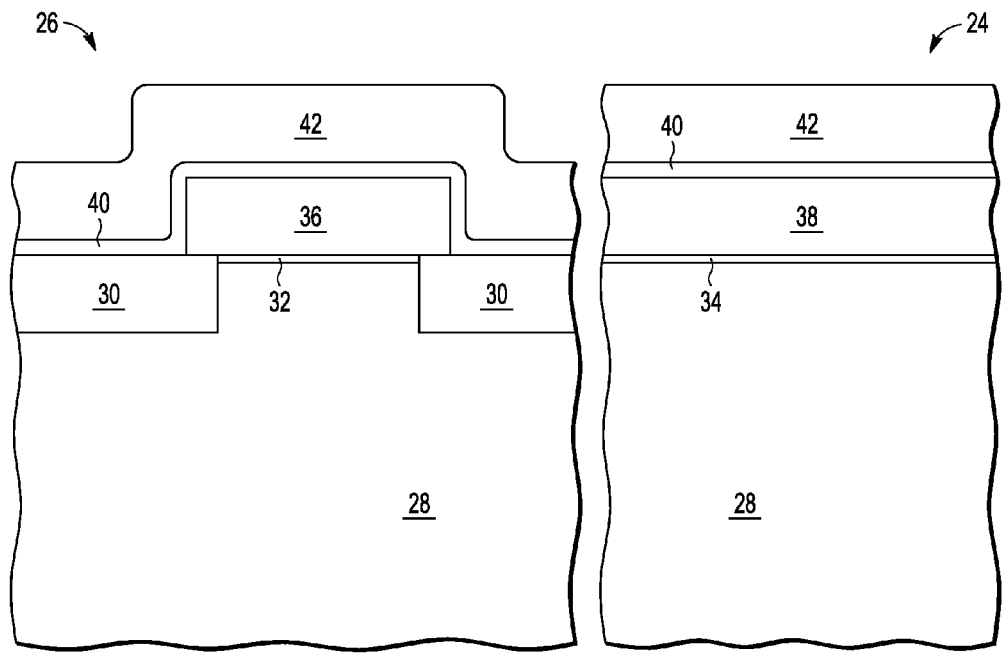
FIG. 5 is a cross section of the two the different portions shown in FIG. 4 at a subsequent stage in processing.

Shown in FIG. 5 are NVM gate stack 24 and dummy gate stack 26 after depositing a conductive layer 42 over dielectric layer 40. Conductive layer 42 may be polysilicon. For the case of conductive layers 36, 38, and 42 being polysilicon, layers 36 and 38 may be called first poly and layer 42 may be called second poly.

Figure 6:
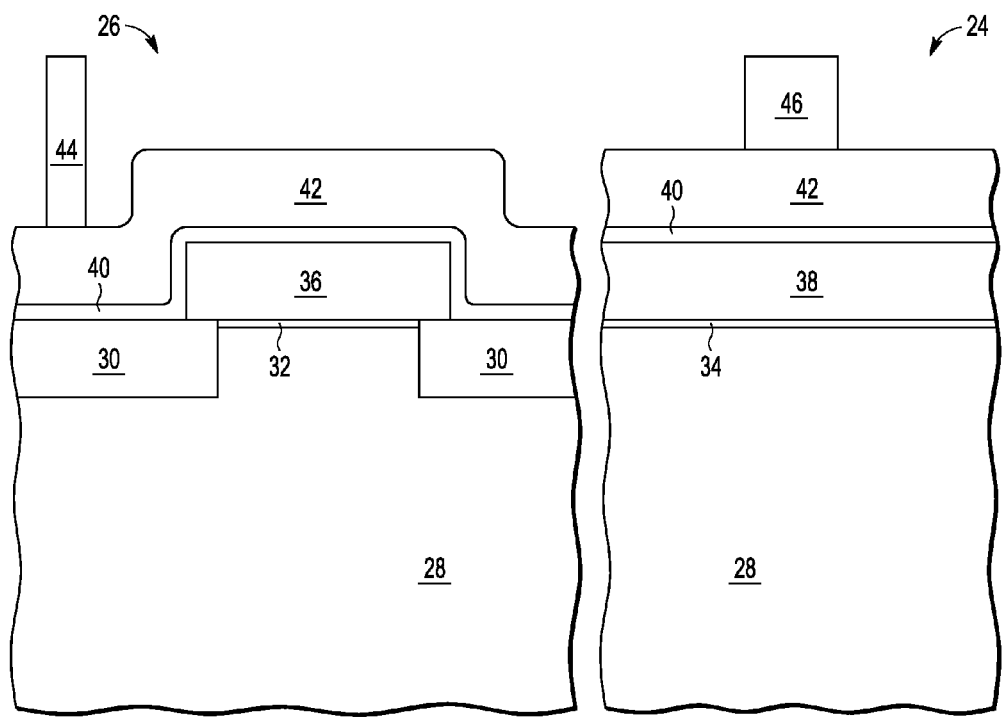
FIG. 6 is a cross section of the two the different portions shown in FIG. 5 at a subsequent stage in processing.

Shown in FIG. 6 are NVM gate stack 24 and dummy gate stack 26 after forming patterned photoresist portion 44 in the region where dummy gate stack 26 is formed and patterned photoresist portion 46 where NVM gate stack 24 is formed.

Figure 7:
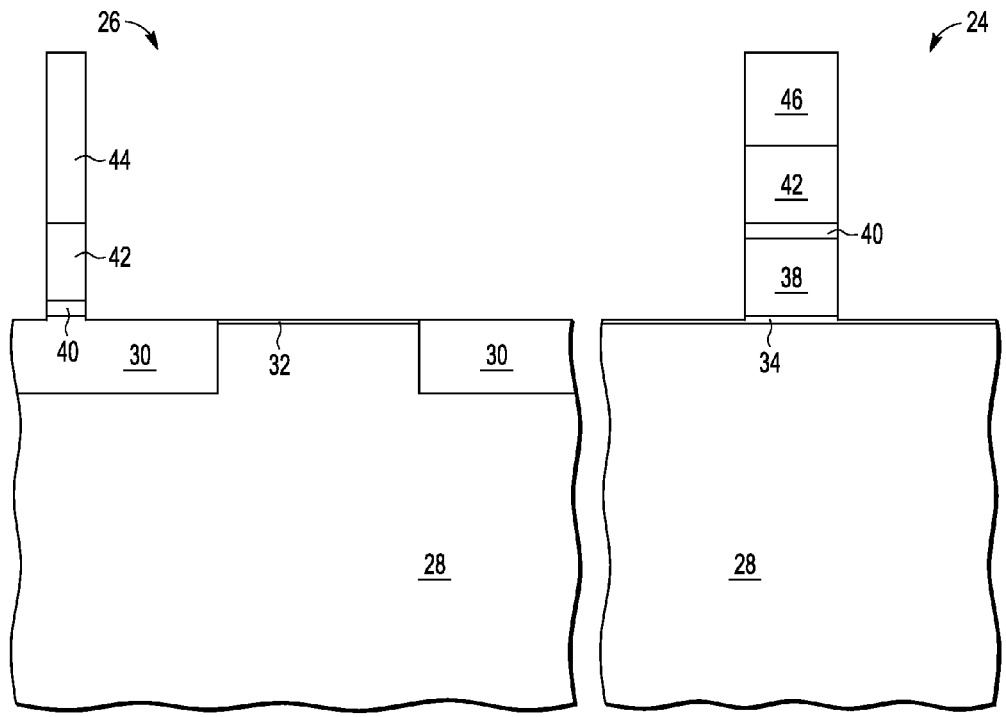
FIG. 7 is a cross section of the two the different portions shown in FIG. 6 at a subsequent stage in processing.

Shown in FIG. 7 are NVM gate stack 24 and dummy gate stack 26 after etching through conductive layer 42, dielectric layer 40, and conductive layers 36 and 38. During this etch on the side where dummy gate stack 24 has been removed, the etch has left a portion of conductive layer 42 over isolation 30 and completely removed conductive layers 36 and 42 in the active region surrounded by isolation 30. This shows that dummy dielectric 32 is exposed and is useful for endpoint detection. During this etch conductive layers 38 and 42 are patterned to desirably have nearly vertical sidewalls using an anisotropic etch. This etch is ended by detecting that the etch has reached gate dielectric 34 in the region of NVM gate stack 24. A change in the material composition in the etch chamber is detected when the etch is no longer vertically etching polysilicon and is slowly etching gate dielectric 34 and dummy dielectric 32 both of which may be grown oxide and which may also be called thermal oxide. Dummy dielectric 32 thus provides additional material for detection that the end point has been reached. At this time, most of the first poly layer has been removed because it is etched in the formation of gates for the other circuitry such as logic circuits 16 and 20, analog circuit 18, and SRAM 14. Since most of the first poly material has been removed, it is beneficial for endpoint detection for there to be some gate dielectric type material, such as that present over the active region surrounded by isolation region 30, to be exposed at the same time as gate dielectric 34 is exposed at the end of the etch of NVM gate stack 24.

Figure 8:
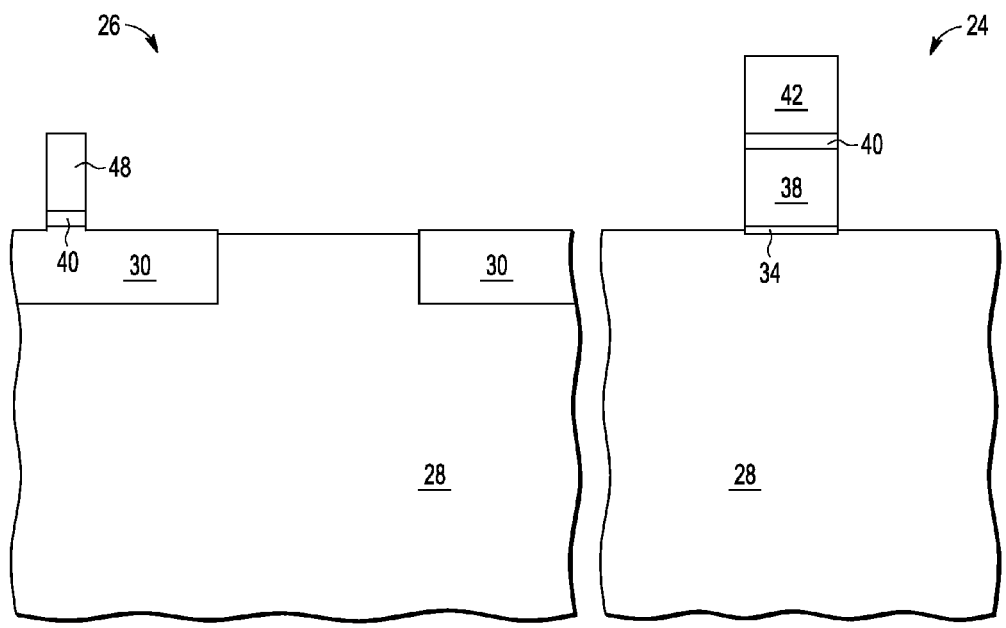
FIG. 8 is a cross section of the two the different portions shown in FIG. 7 at a subsequent stage in processing.

Shown in FIG. 8 are NVM gate stack 24 and dummy gate stack 26 after removing the remaining exposed portions of dummy dielectric 32 and gate dielectric 34. The portion of second poly remaining on the region of dummy gate stack 26 is a tile 48 that includes a portion of dielectric layer 40. Tile 48 is over isolation and is for use in other functions such as providing support for subsequent chemical mechanical polishing (CMP). At subsequent logic poly patterning, the patterned area 26 is covered by photoresist to protect the features formed from subsequent etching. In this example, dummy gate stack 26 is built up and then nearly completely removed leaving only tile 48. This shows that the region of the dummy gate stack can be used for tiling and thus dummy gate stack 26 may require little, if any, additional space from that required for making just the tile. In a similar manner, the scheme described here can be used to form circuit features where polysilicon does not overlie active. Examples of such features are polysilicon resistors and polysilicon shields of fringe capacitors. Not shown in FIGS. 1-8 are other transistors such as logic transistors. In the case of the logic transistors, it may be convenient to use layer 42 as the layer for the gates of the logic transistors.

Figure 9:
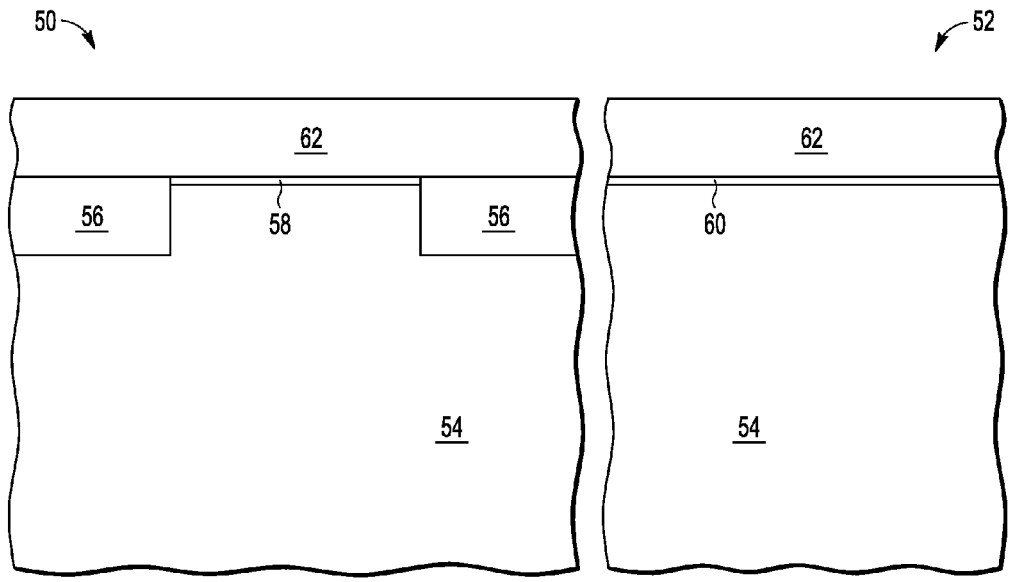
FIG. 9 is a cross section of two different portions of an integrated circuit similar to that of FIG. 1 at a stage in processing according to a second embodiment.

Shown in FIG. 9 are NVM gate stack 50 and dummy gate stack 52 at a stage in processing that would be an alternative to the processing shown in FIG. 3. NVM gate stack 52 is the same as NVM gate stack 24 and dummy gate stack 50 is for performing substantially the same function as dummy gate stack 26 but in a different way. As shown in FIG. 9, a substrate 54 has an isolation region 56 surrounding an active region in the region of dummy gate stack 50 and a dummy dielectric layer 58 on the active region. In the region of NVM gate stack 52 is a gate dielectric 60. Dielectrics 58 and 60 may be thermal oxide. A conductive layer 62 is deposited over dielectrics 58 and 60 and over isolation 56. Conductive layer 62 may be polysilicon.

Figure 10:
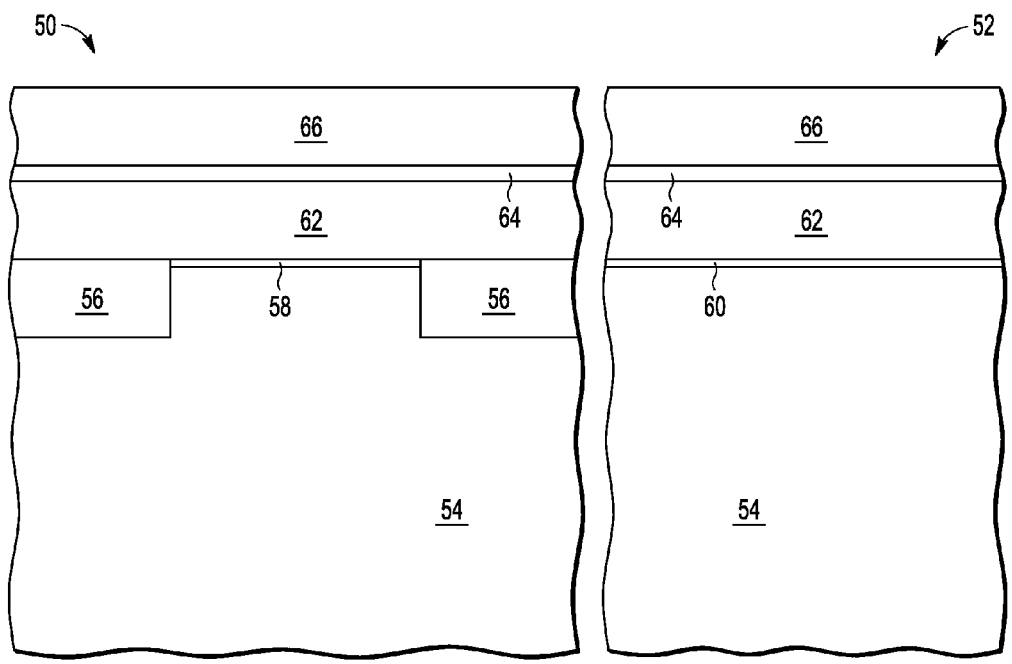
FIG. 10 is a cross section of the two different portions shown in FIG. 9 at a subsequent stage in processing.

Shown in FIG. 10 are NVM gate stack 52 and dummy gate stack 50 after depositing a dielectric layer 64, which may be ONO, on conductive layer 62 and a conductive layer 66 on dielectric layer 64. Conductive layer 66 may be polysilicon.

Figure 11:
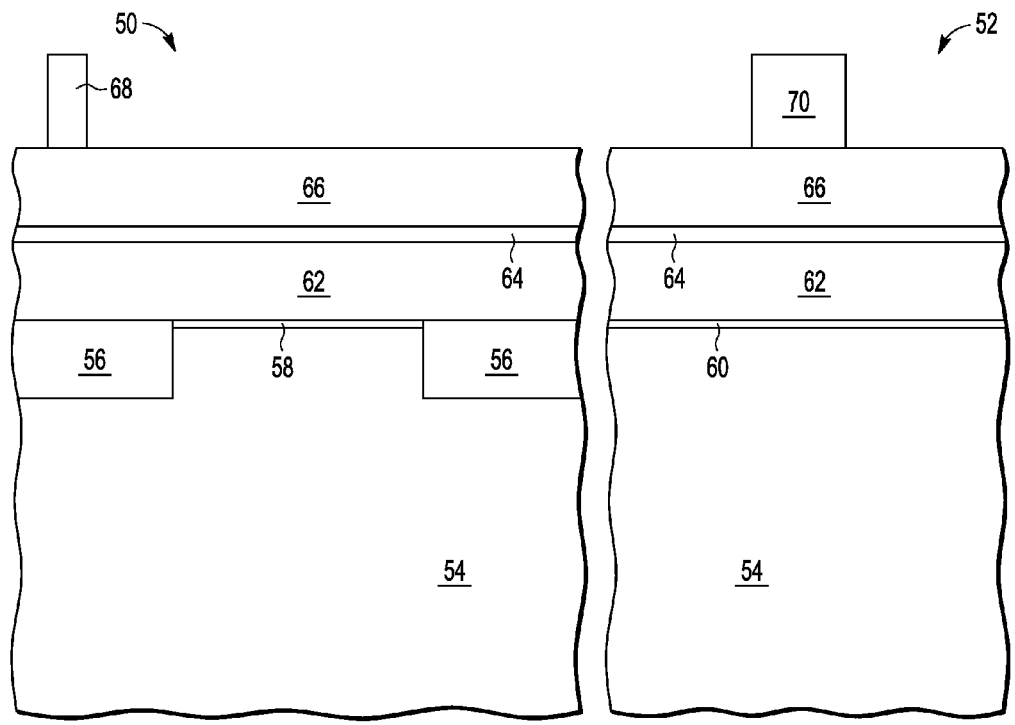
FIG. 11 is a cross section of the two different portions shown in FIG. 10 at a subsequent stage in processing.

Shown in FIG. 11 are NVM gate stack 52 and dummy gate stack 50 after forming a patterned photoresist portion 68 on conductive layer 66 and over isolation 56 and a patterned portion 70 on conductive layer 66 and over gate dielectric 60.

Patterned photoresist portion 68, as in the case of photoresist portion 44 of FIG. 6, is for defining a tile. Patterned photoresist portion 70, as in the case of photoresist portion 46 of FIG. 6, is for defining NVM gate stack 52.

Figure 12:
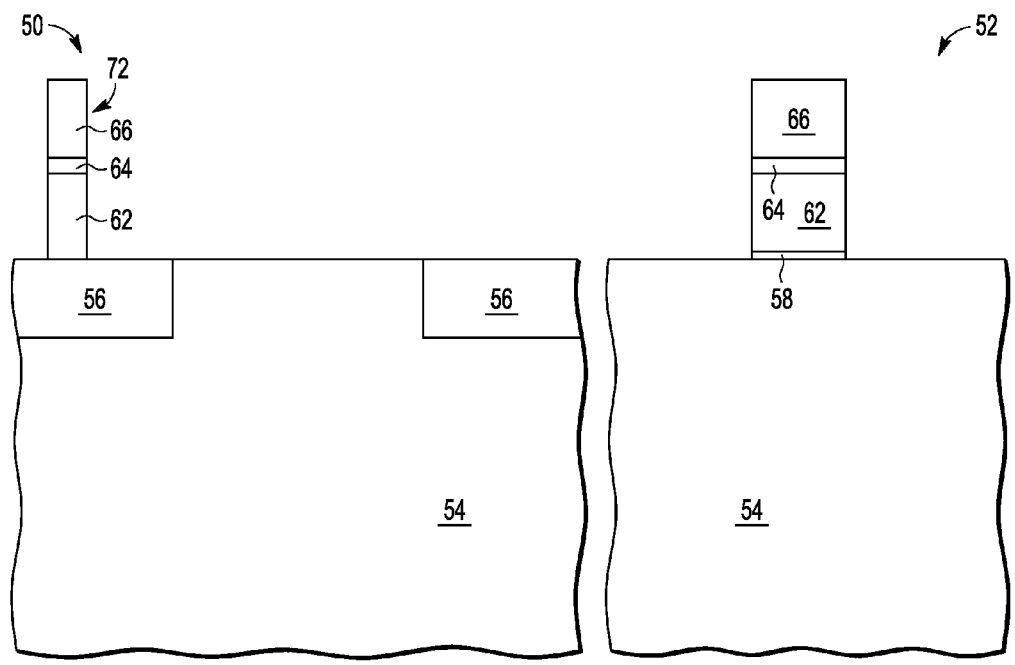
FIG. 12 is a cross section of the two different portions shown in FIG. 11 at a subsequent stage in processing.

Shown in FIG. 12 are NVM gate stack 52 and dummy gate stack 50 after performing an etching according to the pattern of patterned photoresist portions 68 and 70 analogous to the steps depicted in FIGS. 7 and 8 and removing photoresist portions 68 and 70. This etch utilizes endpoint detection that uses dummy dielectric 58 receiving the etchant that etched conductive layer 62. The resulting structure under photoresist portion 68 is structure 72.

Figure 13:
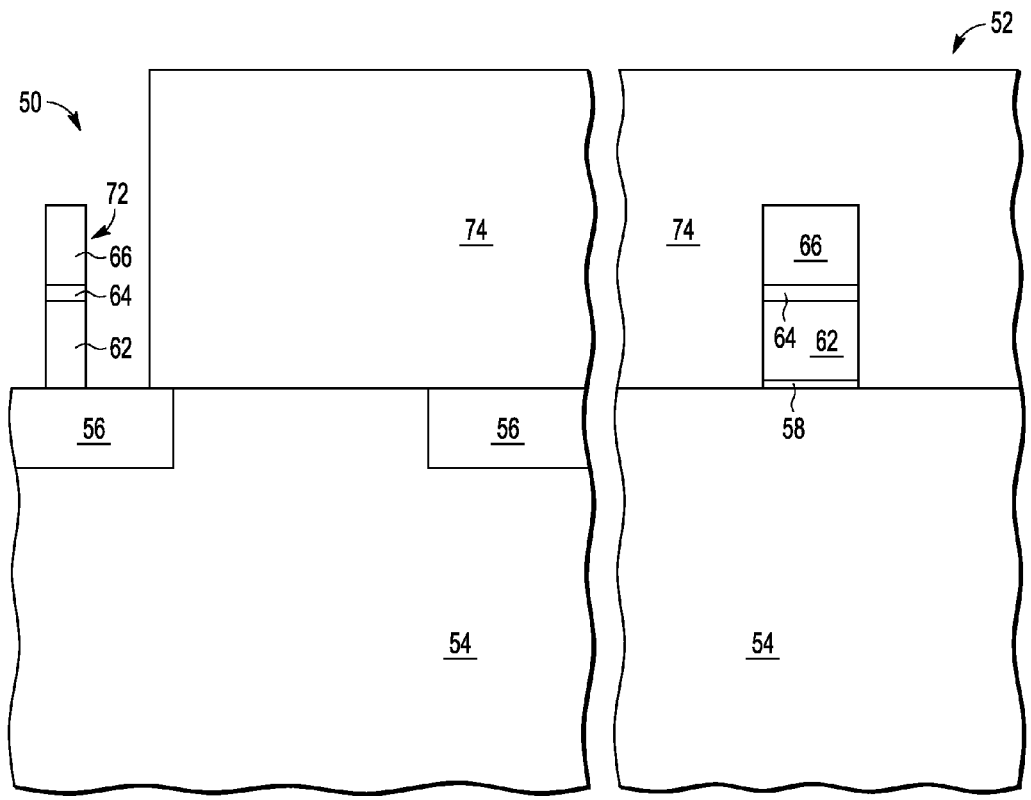
FIG. 13 is a cross section of the two different portions shown in FIG. 12 at a subsequent stage in processing.

Shown in FIG. 13 are NVM gate stack 52 and dummy gate stack 50 covering NVM gate stack 52 and covering the region of dummy gate stack 50 except for structure 72. This use of photoresist is for an etch, which may be called a logic poly etch, in the other areas of integrated circuit 10 to form transistor gates formed in second poly.

Figure 14:
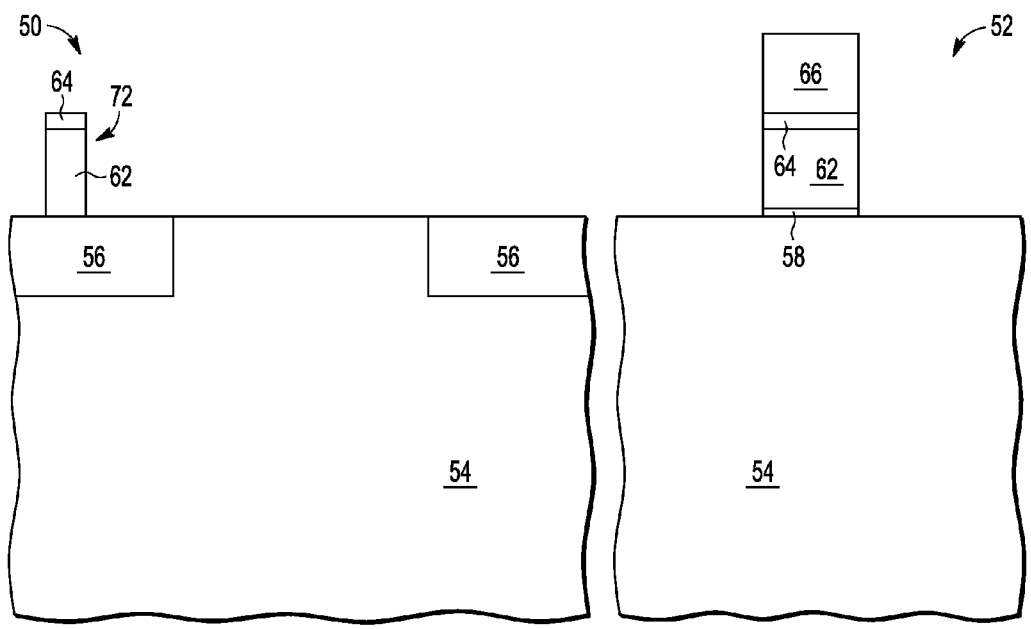
FIG. 14 is a cross section of the two different portions shown in FIG. 13 at a subsequent stage in processing.

Shown in FIG. 14 are NVM gate stack 52 and dummy gate stack 50 after the second poly etch and removal of photoresist 74. The second poly etch stops on dielectric 64 to leave a tile substantially the same as tile 48 of FIG. 8 but in the case of structure 72, dielectric layer 64 is on top of conductive layer 62 instead of the conductive layer being over the ONO layer as in the case of tile 48. In this case, dielectric layer 64 provides some assistance in endpoint detection in the etch of second poly for forming the logic transistors. Structure 72 can be used as a tile in the same manner as tile 48.

Figure 15:
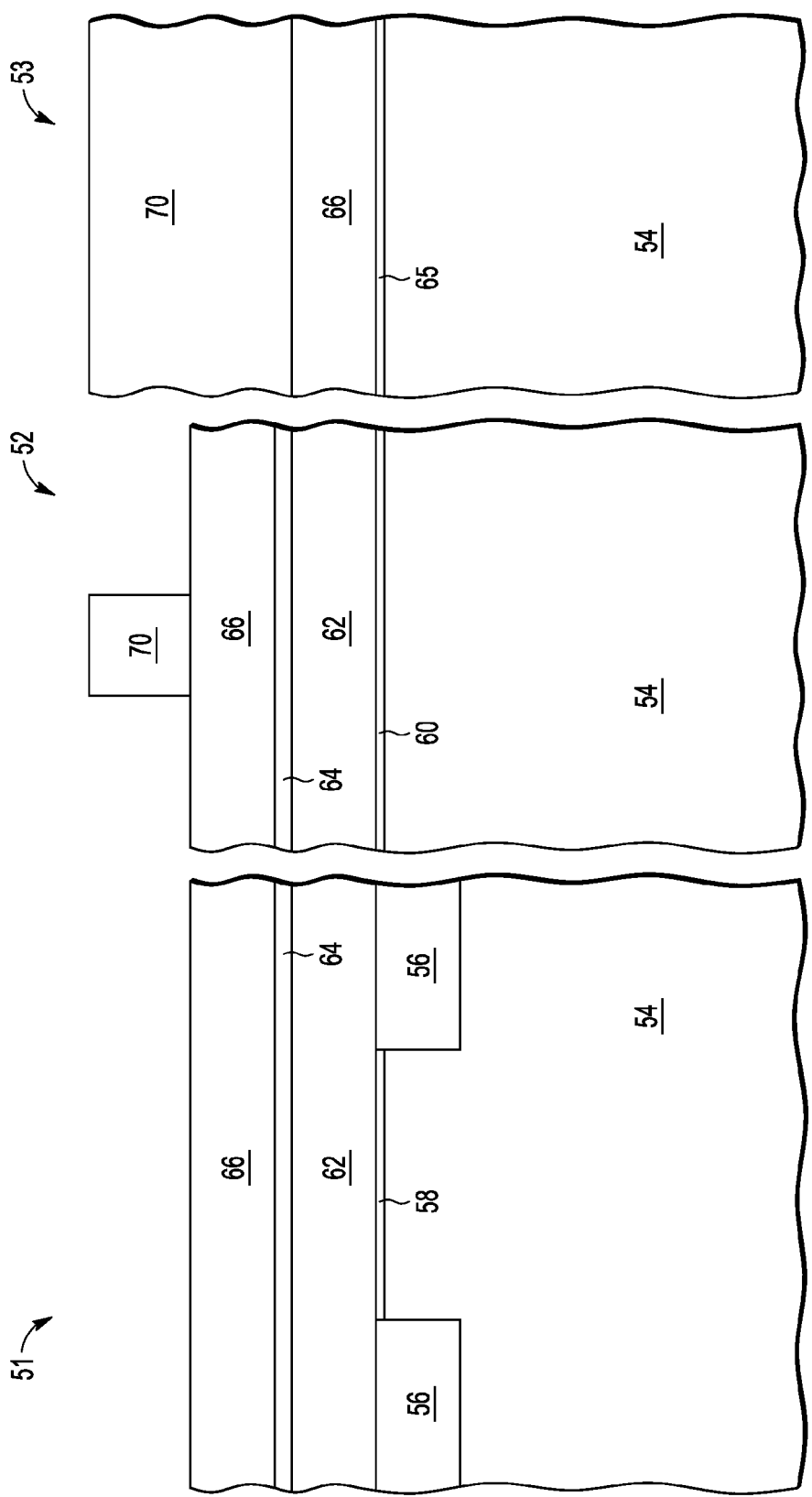
FIG. 15 is a cross section of a device structure at a stage in processing subsequent to that shown in FIG. 10 according to a third embodiment.

Shown in FIG. 15, as an alternative to the process that results in the device structure of FIG. 11, is a dummy gate stack 51 that does not include patterned photoresist. Dummy gate stack 50 of FIG. 11 includes a portion of photoresist layer 70 that results in tile 72 as shown in FIG. 14. Also shown in FIG. 15 is a logic gate stack 53 that is over substrate 54. Photoresist layer 70 completely covers logic gate stack 53. As shown in FIG. 15, logic gate stack 53 includes a gate dielectric 65 formed on substrate 54 and polysilicon layer 66. Polysilicon layer 66, the second polysilicon layer deposited, has not been patterned during the processing depicted in FIGS. 9 and 10. Polysilicon layer 62 and ONO layer 64 were removed from logic gate stack 53 prior to the structure shown in FIG. 9.

Figure 16:
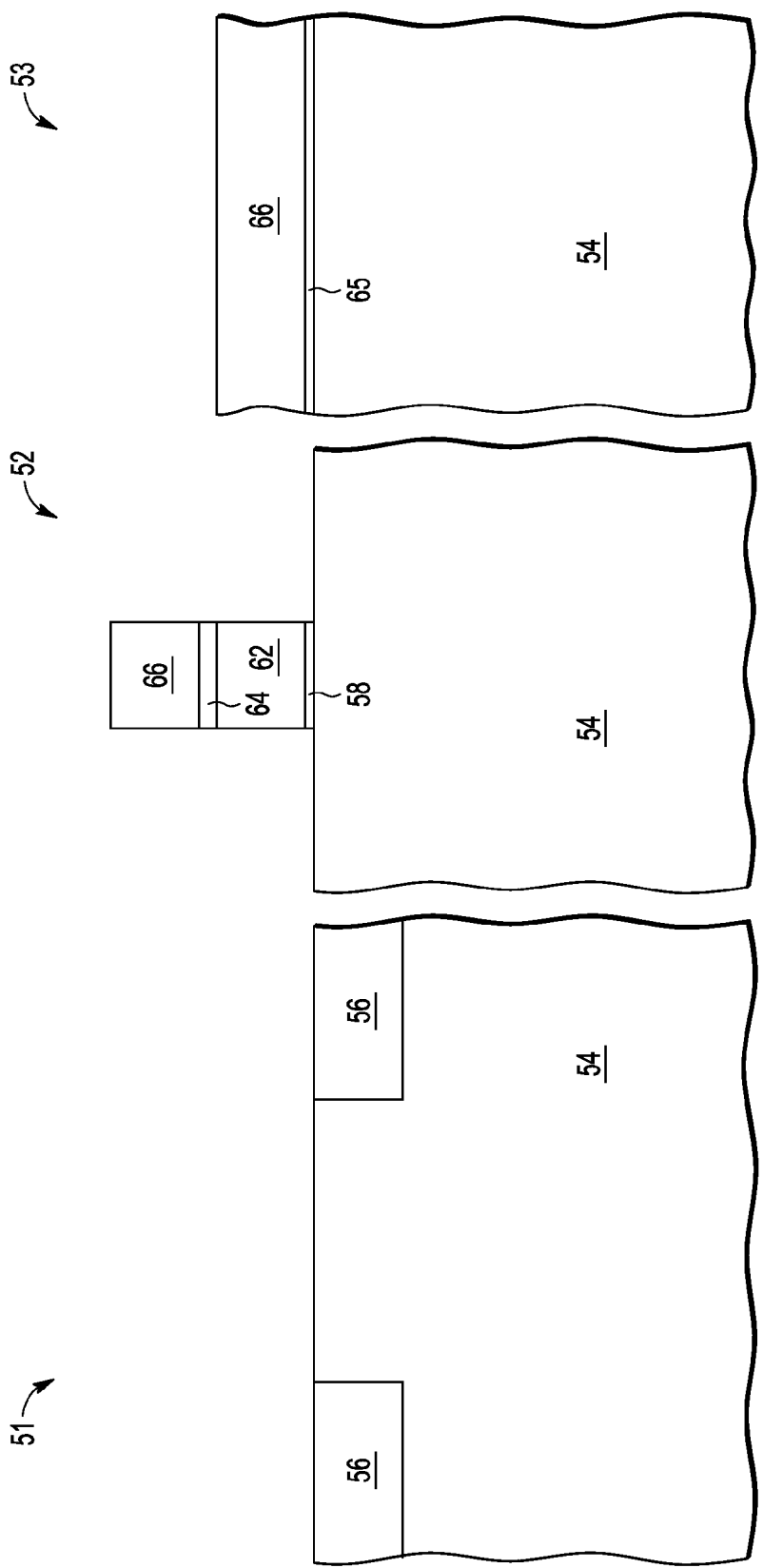
FIG. 16 is a cross section of the device structure shown in FIG. 15 at a subsequent stage in processing.

Shown in FIG. 16 is dummy gate stack 51 removed, NVM stack 52 patterned according to photoresist layer 70 as patterned in NVM gate stack 52 of FIG. 15, and polysilicon layer 66 unetched. This etch of NVM gate stack 52 benefits from the removal of dummy gate stack 51. Dummy gate stack 51 provides material that is useful for endpoint detection. The material removed during the etch of dummy gate stack 51 that is occurring at the same time as the etch of NVM stack 52 aids in endpoint detection by increasing the signal to noise ratio of the etch trace in the chamber.

Figure 17:
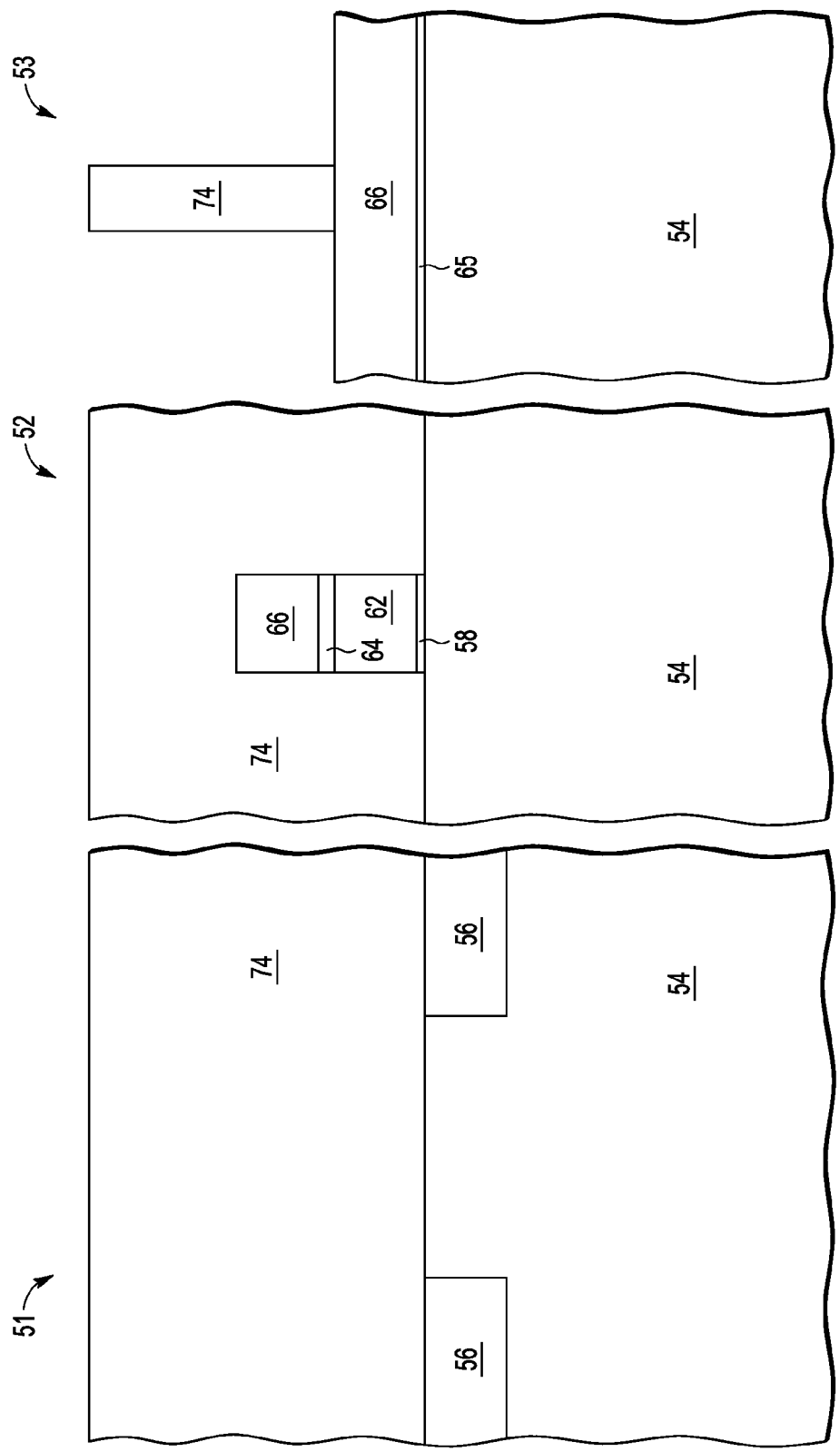
FIG. 17 is a cross section of the device structure shown in FIG. 16 at a subsequent stage in processing.

Shown in FIG. 17 is the region of dummy gate stack 51 being covered by photoresist 74, NVM stack 52 covered by photoresist 74, and logic gate 66 having a patterned portion of photoresist 74 on polysilicon layer 66. Polysilicon layer 66 has already been removed from dummy gate stack 51.

Figure 18:
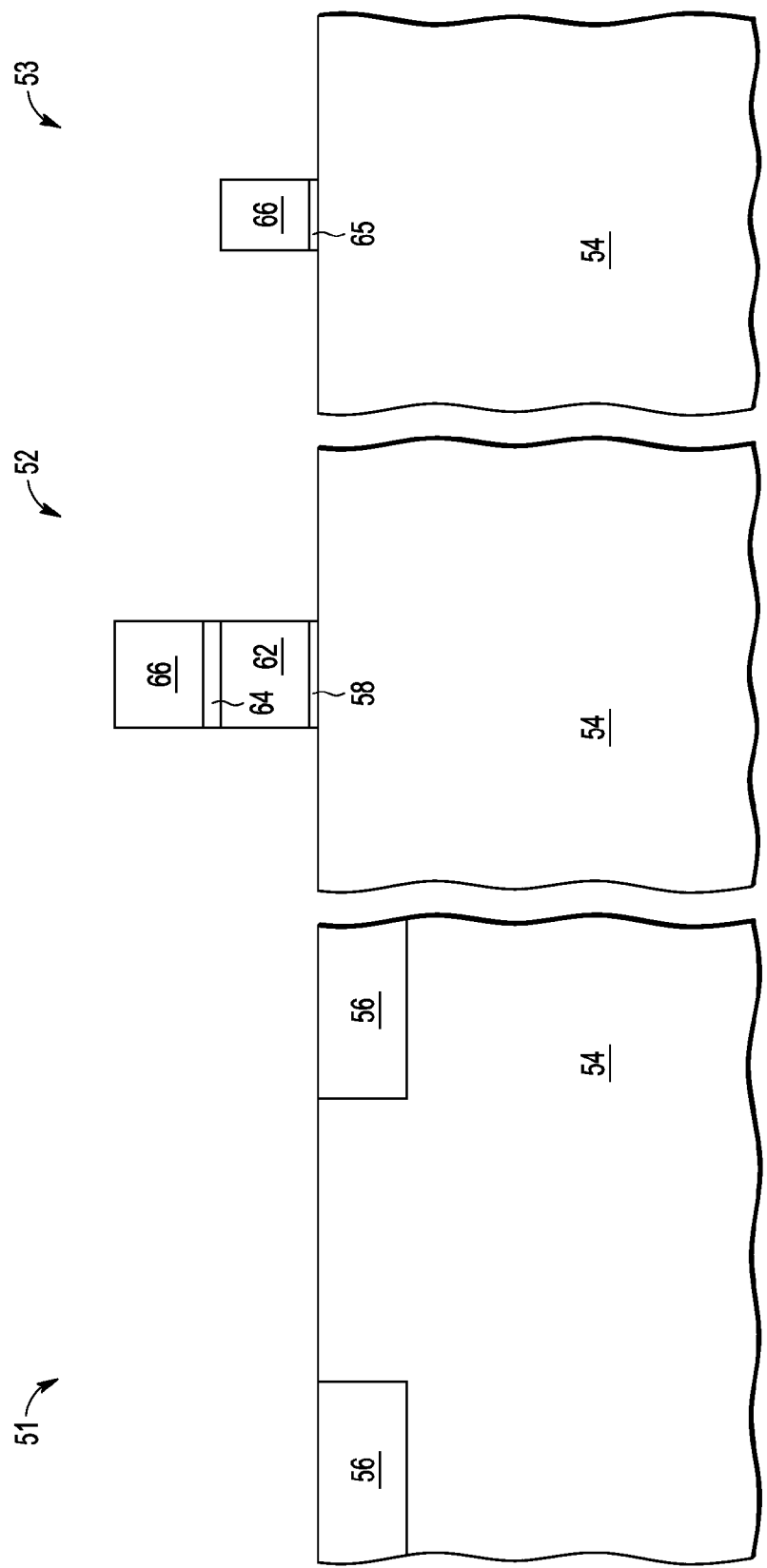
FIG. 18 is a cross section of the device structure shown in FIG. 17 at a subsequent stage in processing.

Shown in FIG. 18, is logic gate stack 53 after having been etched according to the portion of photoresist layer 74 patterned as shown in FIG. 17. Thus, the etch of the second polysilicon layer for logic transistors is performed at a different time from when the second polysilicon layer is removed from the region of the dummy gate stack. The complete removal of dummy gate stack 51 provides for a convenient use of this approach of FIGS. 15-18 for use over the region where no polysilicon need be present in the final structure such as an edge seal. Other circuit features such as well ties, active diodes, active resistors, and active shields of fringe capacitors may be formed in a similar manner.

Figure 19:
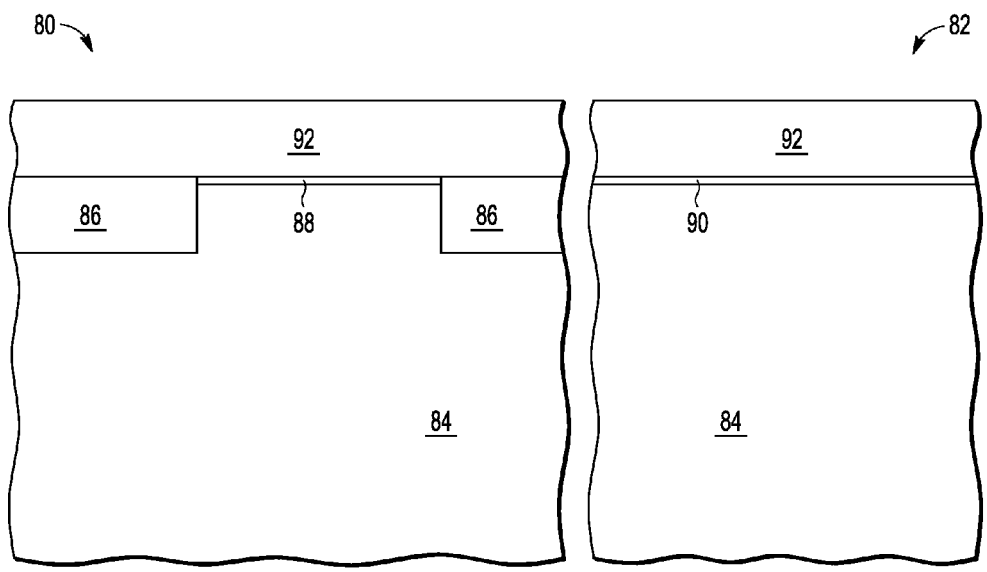
FIG. 19 is a cross section of two different portions of an integrated circuit similar to that of FIG. 1 at a stage in processing according to a fourth embodiment.

Shown in FIG. 19 is a structure, substantially the same as shown in FIG. 9 and may be the same but is for use in making a split gate NVM cell. As shown in FIG. 15, there are regions for an NVM gate stack 82 and dummy gate stack 80 comprising a substrate 84, an isolation region 86 surrounding an active region in the region for dummy gate stack 80, a dummy dielectric 88 on the active region, a gate dielectric 90 on substrate 84 in the region of NVM gate stack 82, and a conductive layer 92 on dummy dielectric 88 and gate dielectric 90. Typically, the conductive layers are polysilicon and may referenced as polysilicon layers but other conductive materials may also be found to be effective.

Figure 20:
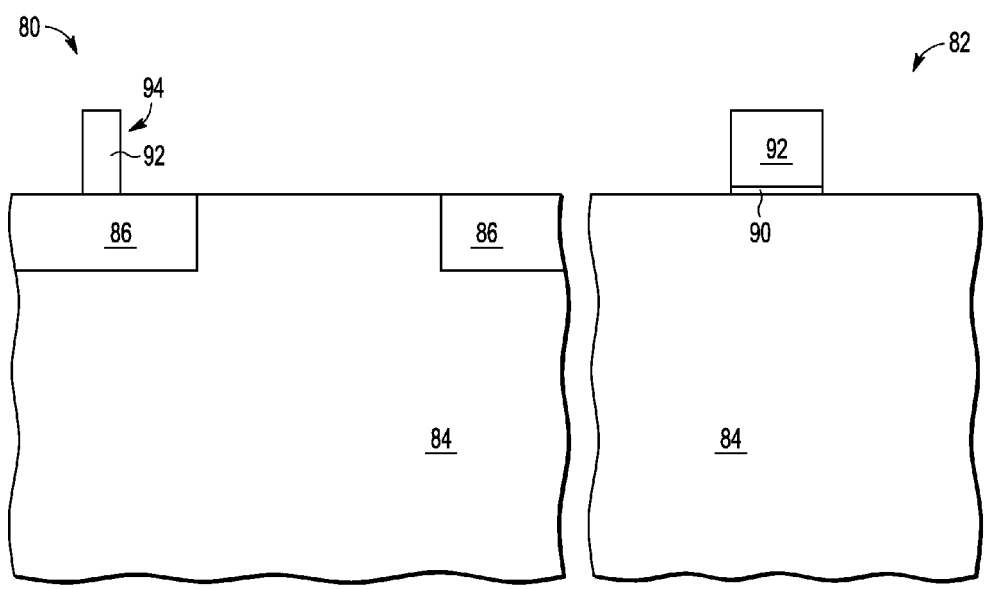
FIG. 20 is a cross section of the two different portions shown in FIG. 19 at a subsequent stage in processing.

Shown in FIG. 20 are NVM gate stack 82 and dummy gate stack 80 after selectively etching conductive layer 92 to leave a tile 94 in the region of dummy gate stack on isolation 86 and a portion of conductive layer 92 on gate dielectric 90 that is to function as a select gate. The etch of conductive layer 92 benefits in performing endpoint detection by etching conductive layer 92 over the active region in the region of dummy gate stack 80. The endpoint detection does also benefit from the removal of first poly that is on isolation 86. This also applies to the removal of first poly over isolation 30 and 56 when removing first poly in the regions of NVM gate stacks 24 and 52, respectively.

Figure 21:
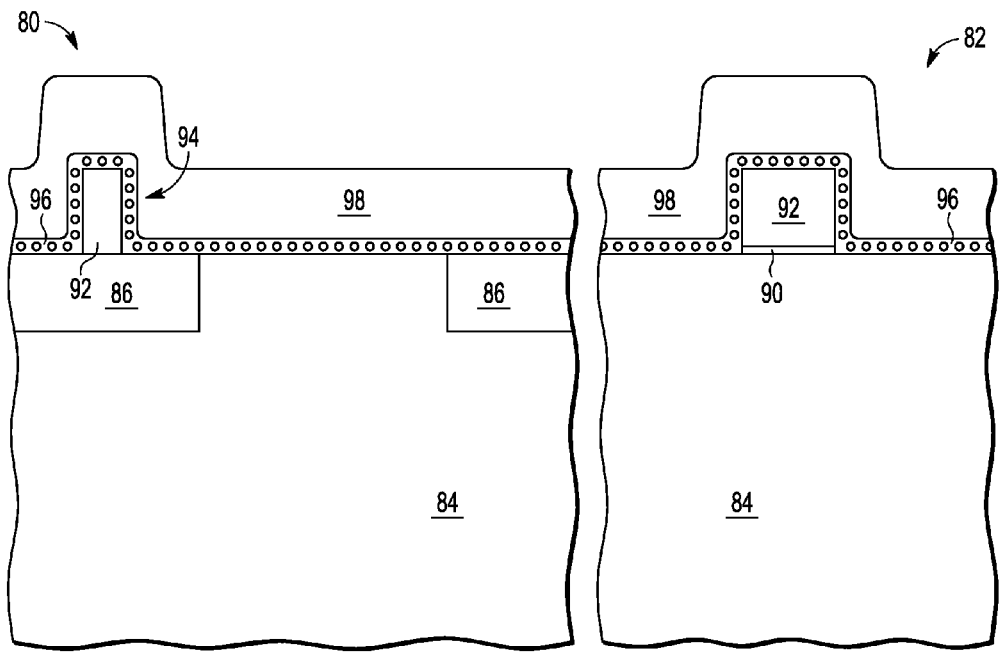
FIG. 21 is a cross section of the two different portions shown in FIG. 20 at a subsequent stage in processing.

Shown in FIG. 21 are NVM gate stack 82 and dummy gate stack 80 after depositing a nanocrystal layer 96 over the regions of NVM gate stack 82 and dummy gate stack 80 and a conductive layer 98 over nanocrystal layer 96. Nanocrystal layer 96 is for non-volatile charge storage. Tile 94 is covered by nanocrystal layer 96 and conductive layer 98.

Figure 22:
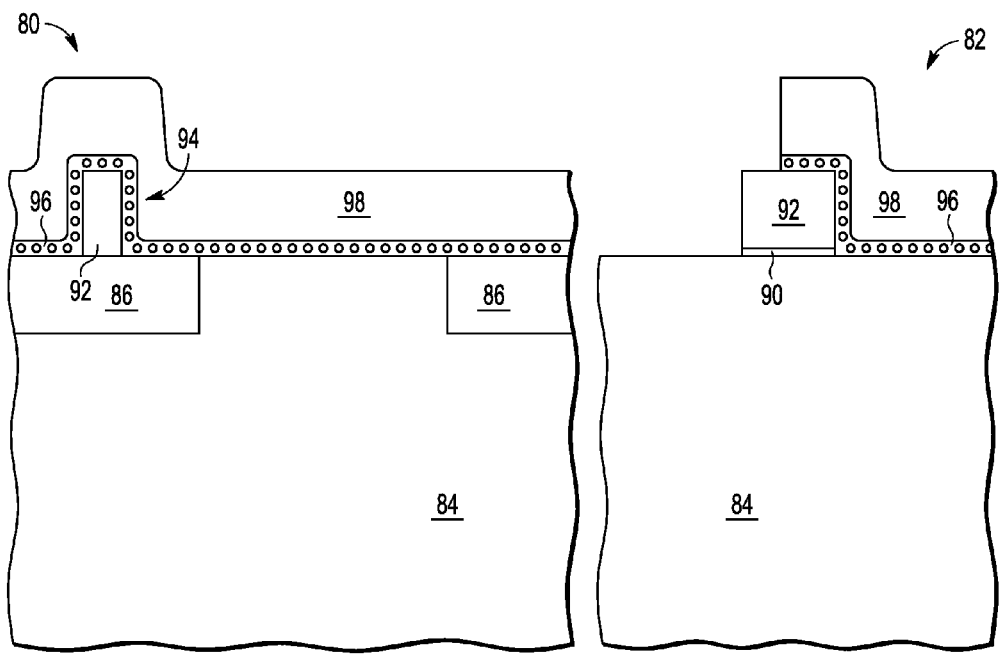
FIG. 22 is a cross section of the two different portions shown in FIG. 21 at a subsequent stage in processing.

Shown in FIG. 22 are NVM gate stack 82 and dummy gate stack 80 after performing a patterned etch of conductive layer 98 in the region of NVM gate stack 82 which removes second poly from over a portion of the remaining portion of conductive layer 92. Nanocrystal layer 96 is removed where conductive layer 98 is removed. Because a very large portion of conductive layer 98 is removed, endpoint detection is not difficult.

Figure 23:
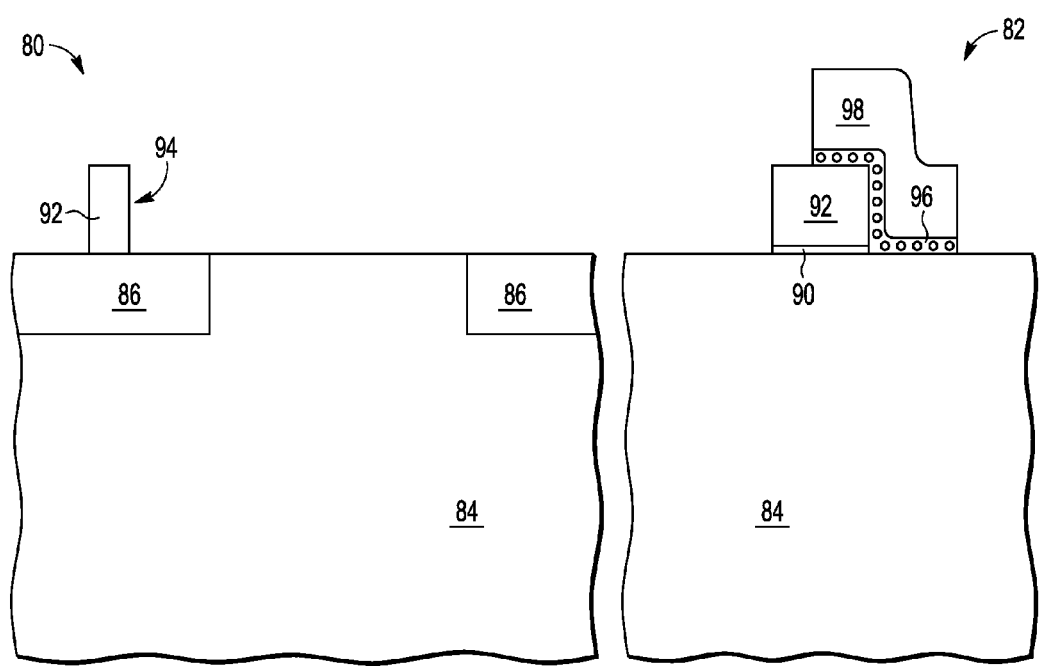
FIG. 23 is a cross section of the two different portions shown in FIG. 22 at a subsequent stage in processing.

Shown in FIG. 23 are NVM gate stack 82 and dummy gate stack 80 after a patterned etch of conductive layer 98 and nanocrystal layer 96 to complete formation of NVM gate stack 82 and to remove conductive layer 98 and nanocrystal layer from the region of dummy gate stack 80. The removal of conductive layer 98 in the region of dummy gate stack 80 assists in the endpoint detection of the etch of conductive layer 98 in the region of NVM gate stack 82. The resulting structure of FIG. 23 includes tile 94 which may be used in the same as described for tiles 48 and 76. In the same manner as forming tile 94 from dummy gate stack 80, a polysilicon feature may be formed and be used for an electrical function.

In an alternate processing scheme to that shown in FIG. 23, nanocrystal stack 96 and conductive layer 98 shown in FIG. 22 are removed from dummy gate stack 80 while patterning the corresponding layers in NVM gate stack 82. In another scheme, when etching conductive layer 92 shown in FIG. 16, the tile 94 is not present. The conductive layer is removed in dummy gate stack 80 and the tile is instead formed by the subsequently deposited nanocrystal layer 96 and conductive layer 98.

Figure 24:
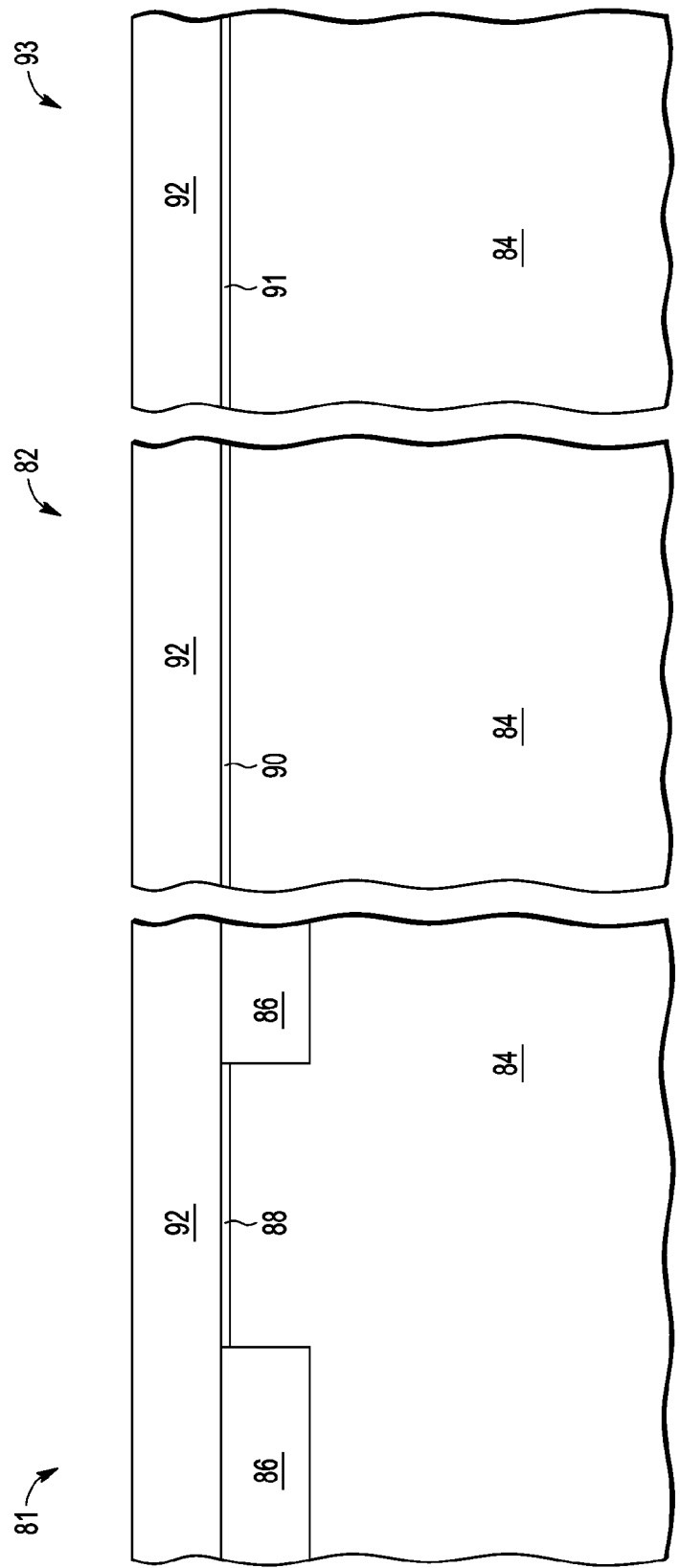
FIG. 24 is a cross section of a device structure like that of FIG. 19 showing a third portion useful in understanding a fifth embodiment.

Shown in FIG. 24 is similar to FIG. 19 but further shows a logic gate stack 93 that includes a gate dielectric on substrate 84 and polysilicon layer 92. Polysilicon layer 92 may be the first polysilicon layer deposited. The presence of logic gate stack 93 is useful in understanding an alternative to the process depicted in FIGS. 20-23.

Figure 25:
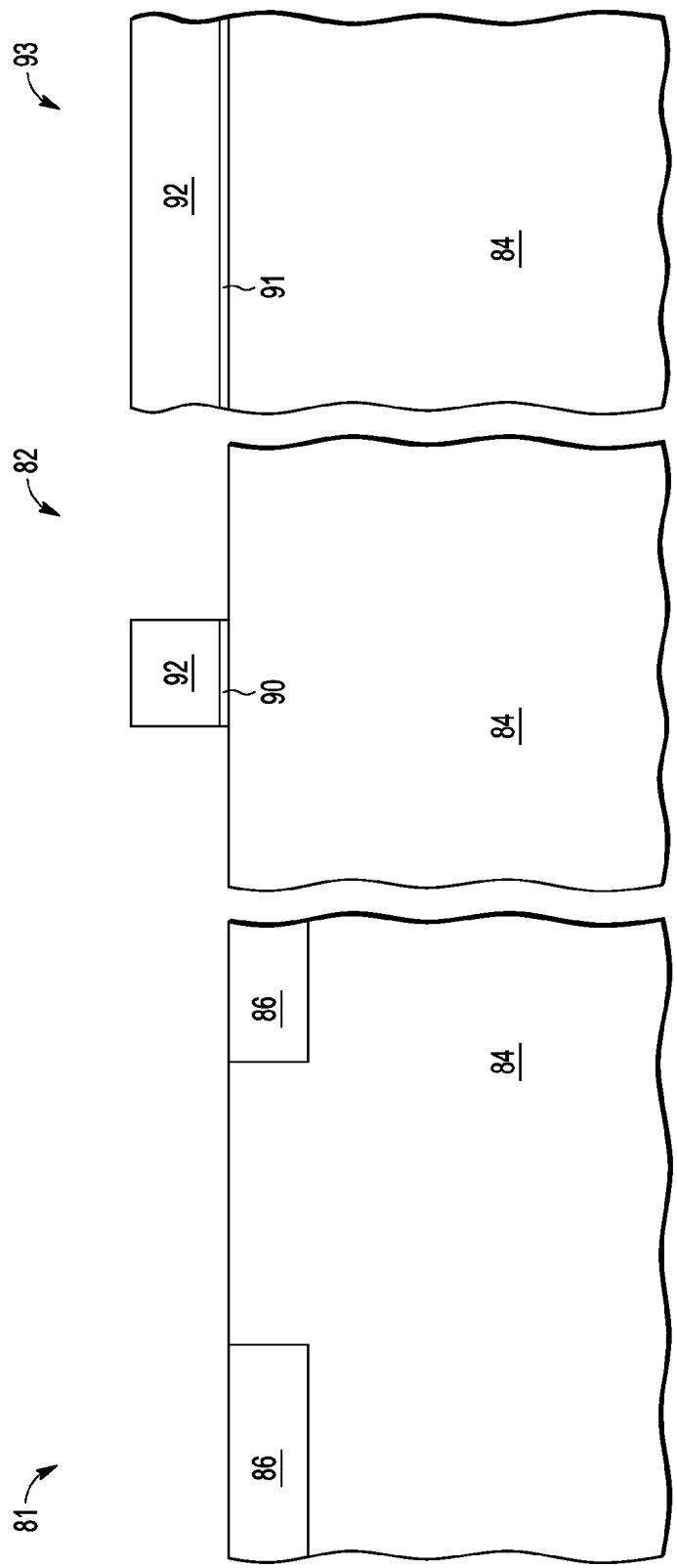
FIG. 25 is a cross section of the device structure of FIG. 24 at a subsequent stage in processing according to the fifth embodiment.

Shown in FIG. 25 is dummy gate stack 80 removed, NVM gate stack 82 patterned, and polysilicon layer 92 in logic gate stack 83 unetched due to being protected by photoresist.

Figure 26:
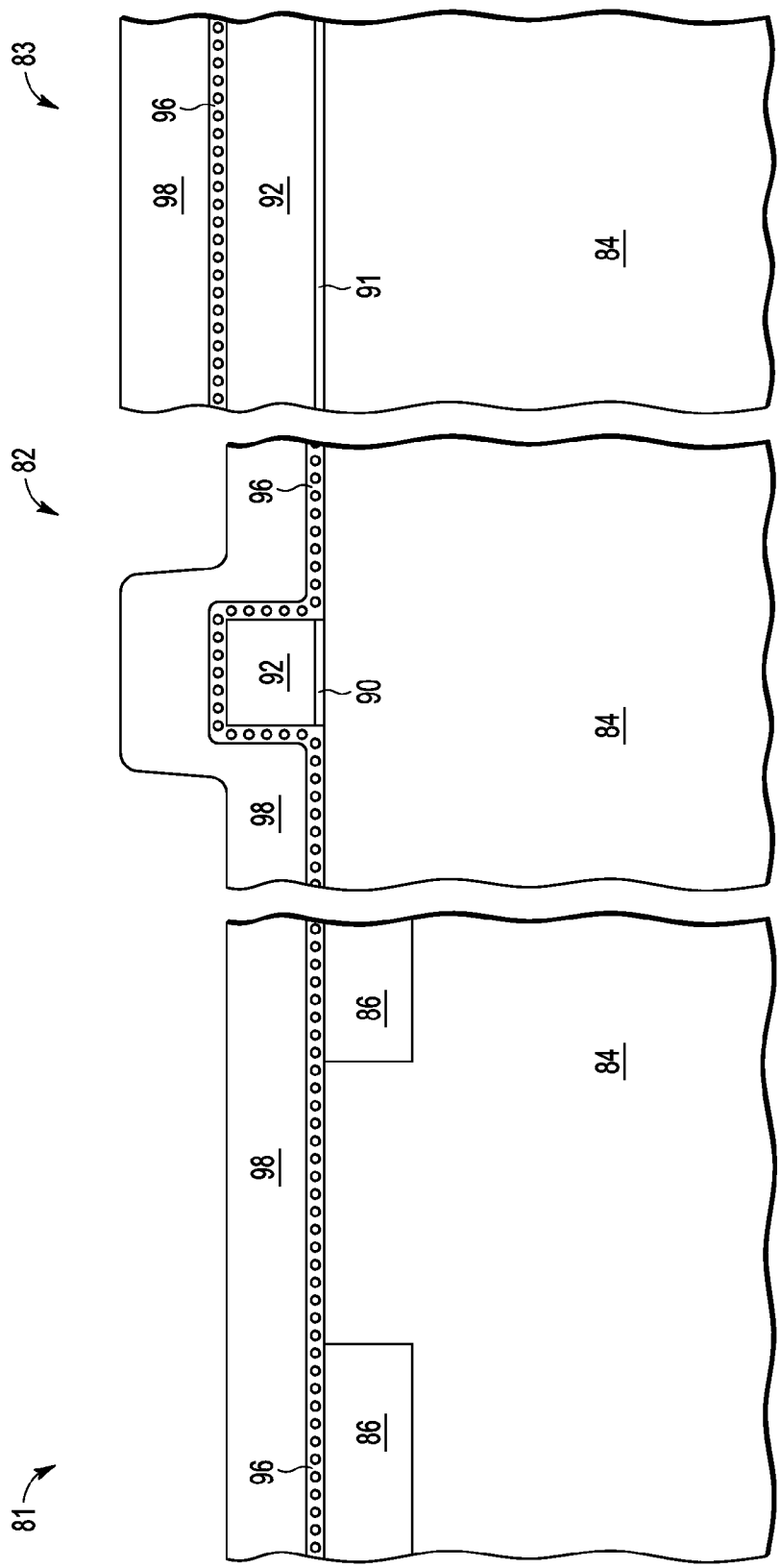
FIG. 26 is a cross section of the device structure of FIG. 25 at a subsequent stage in processing according to the fifth embodiment.

Shown in FIG. 26 are dummy gate stack 81, NVM gate stack 82, and logic gate stack 83 after depositing a charge storage layer 96 and a polysilicon layer 98 on charge storage layer 96. Charge storage layer 96 may be a layer of nanocrystals surrounded by insulating material such as oxide.

Figure 27:
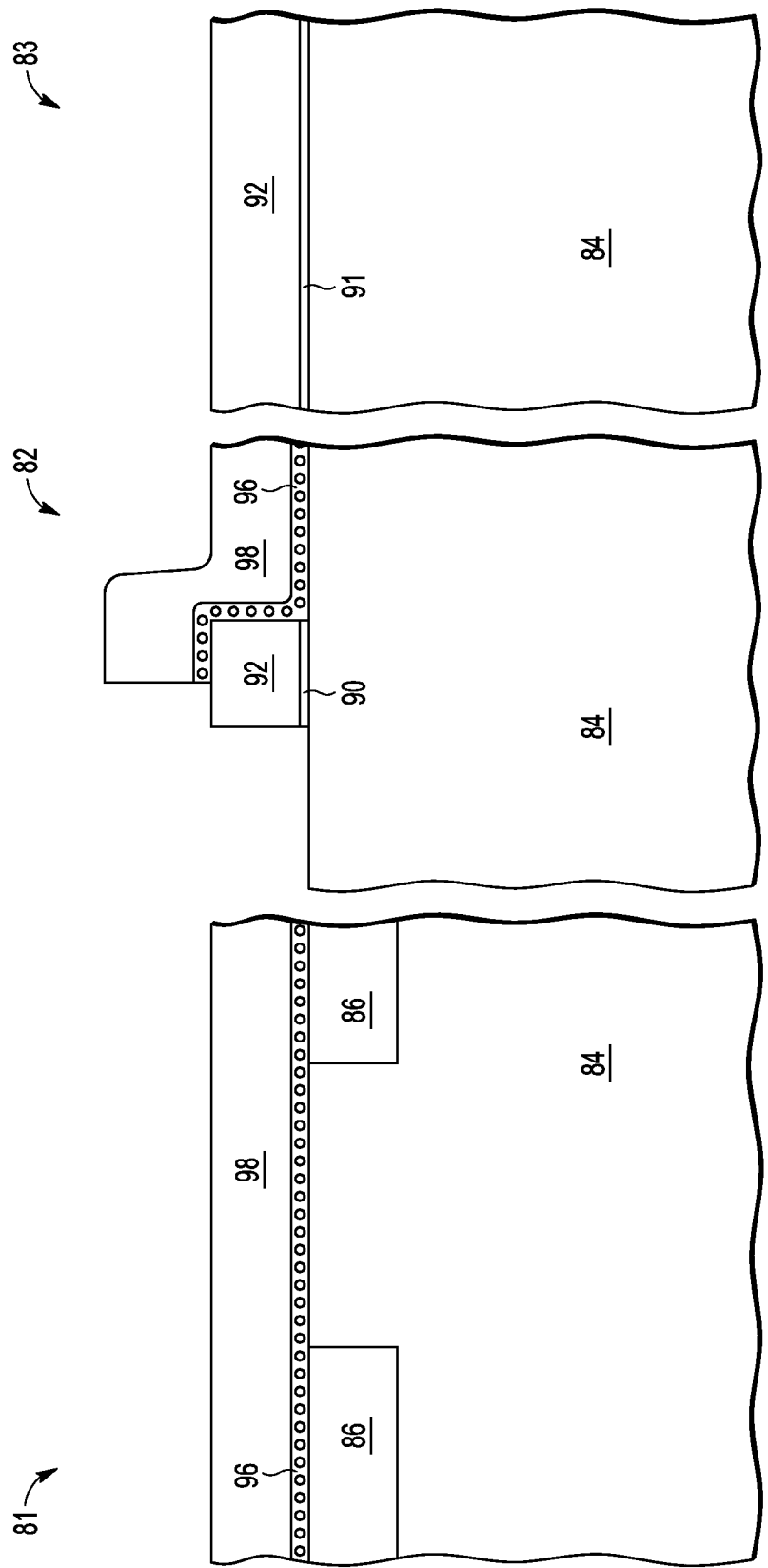
FIG. 27 is a cross section of the device structure of FIG. 26 at a subsequent stage in processing according to the fifth embodiment.

Shown in FIG. 27 is NVM gate stack 82 having polysilicon layer 98 having been pattern etched over the portion of polysilicon layer 92 in NVM gate stack 82. Also the portion of charge storage layer 96 in NVM gate stack 82 that is exposed from the etch of polysilicon layer 98 is also removed.

Figure 28:
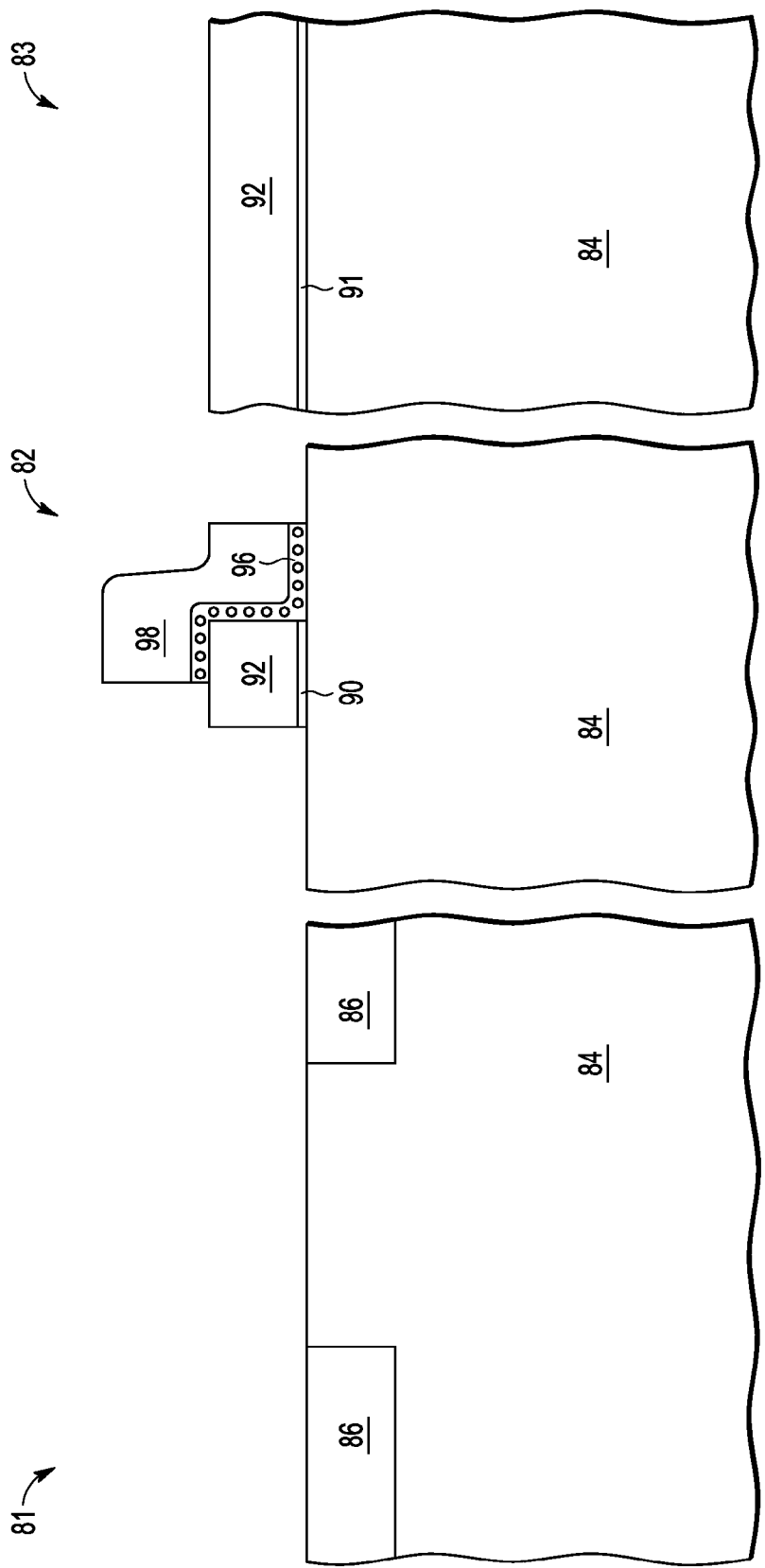
FIG. 28 is a cross section of the device structure of FIG. 27 at a subsequent stage in processing according to the fifth embodiment.

Shown in FIG. 28 is the result of a second patterned etch of polysilicon layer 98 and charge storage layer 96 on the side opposite from the previous etch resulting in FIG. 27. This etch also removes polysilicon layer 92 from dummy gate stack 81. The etch of polysilicon layer 98 benefits from the removal of polysilicon layer 92 from dummy gate stack 81 by increasing the signal to noise ratio for endpoint detection.

Figure 29:
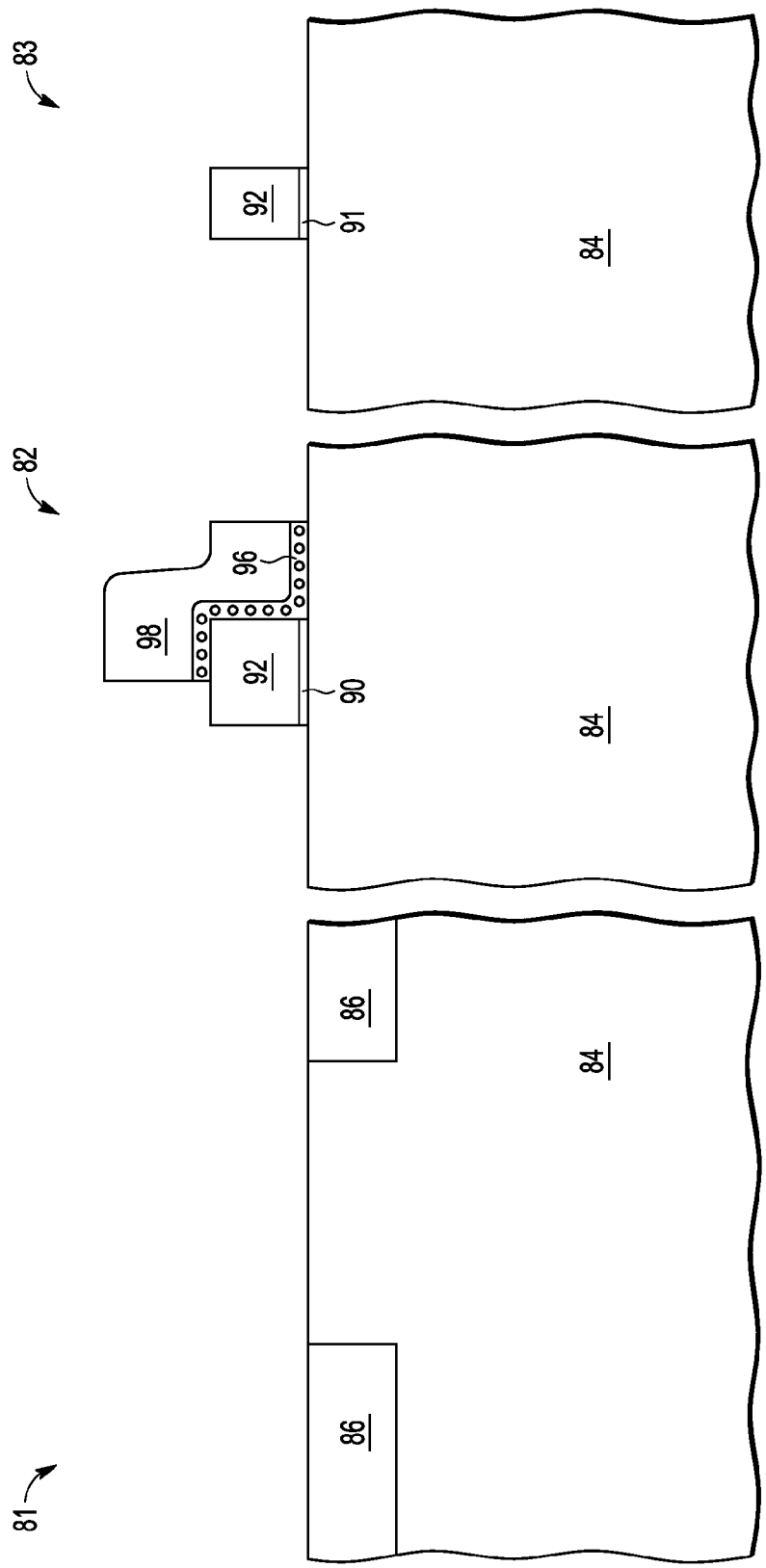
FIG. 29 is a cross section of the device structure of FIG. 28 at a subsequent stage in processing according to the fifth embodiment.
Figure 30:
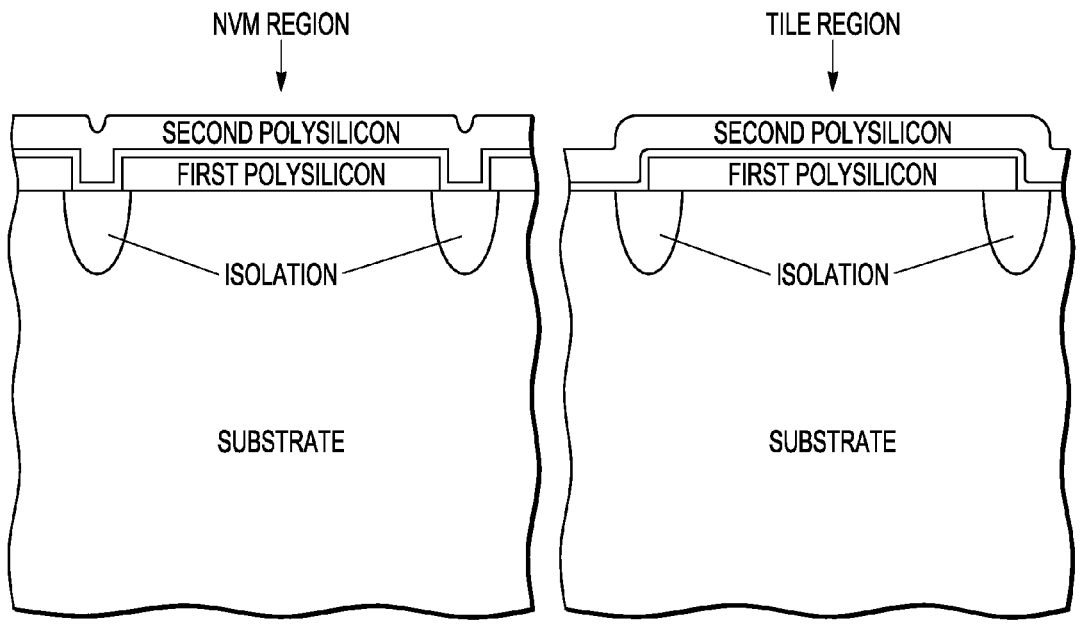
FIGS. 30-32 depict sequential cross sections using a technique according to the prior art.
Figure 31:
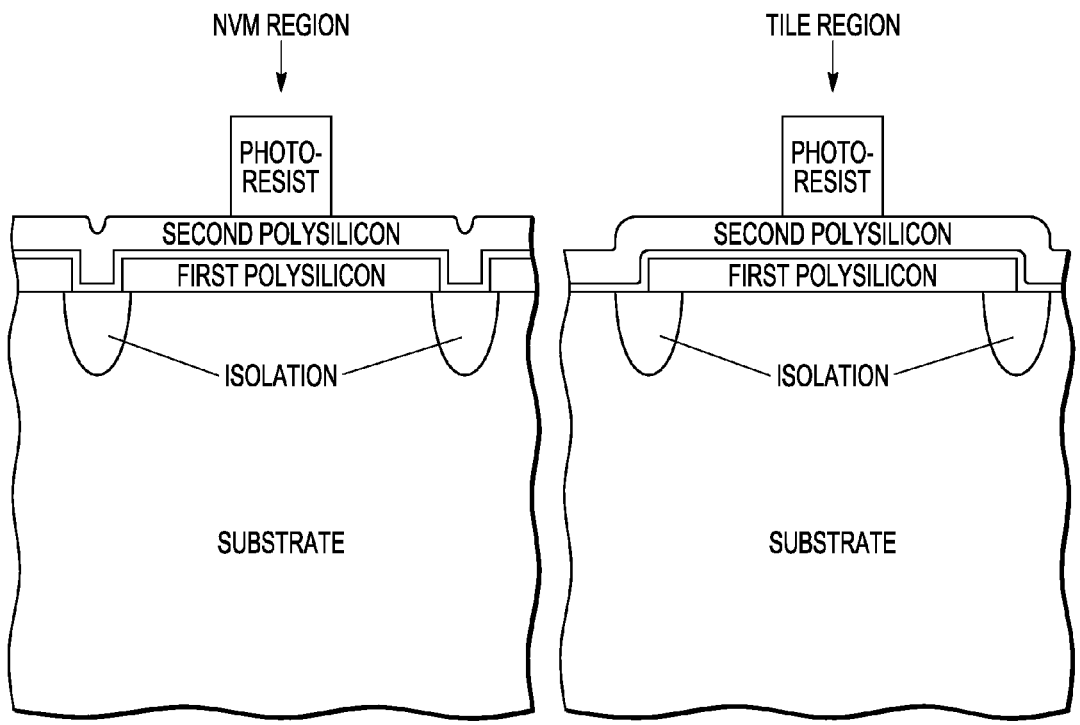
Figure 32:
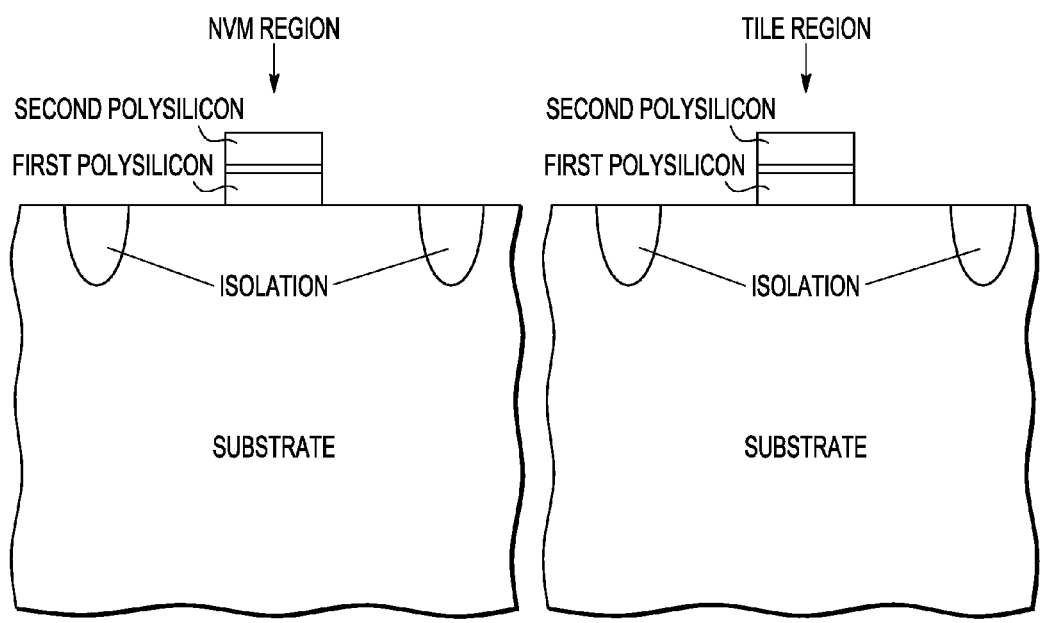

Shown in FIG. 29 is the result of polysilicon layer 92 in logic gate stack 83 being patterned by an etch. This etch of the logic gate stack of the first polysilicon layer occurs at a different time from the etches that pattern first and second polysilicon layers 92 and 98. The region of dummy gate stack 81 has both the first polysilicon layer and the second polysilicon layer removed. Thus, this could an edge seal region or other region where overlying polysilicon layers are not required.

Thus it is seen that use of dummy feature, which may result in some functional feature or be completely sacrificial, can be used in the etching of a NVM gate stack. In the case of a split gate memory cell, the endpoint detection of the etch of both first and second poly is aided by a using the removal of first poly and then second poly as dummy gate stacks.

The semiconductor substrate described herein can be any semiconductor material or combinations of materials, such as gallium arsenide, silicon germanium, silicon-on-insulator (SOI), silicon, monocrystalline silicon, the like, and combinations of the above.

By now it should be appreciated that there has been provided a method for forming a gate stack of a non-volatile memory (NVM) over a semiconductor substrate having an NVM region and a non-NVM region which does not overlap the NVM region. The method includes forming a first conductive layer over the semiconductor substrate in the NVM region and the non-NVM region. The method further includes patterning the first conductive layer to form a first portion of the first conductive layer in the NVM region and a second portion of the first conductive layer in the non-NVM region, wherein the first portion of the first conductive layer is physically separate from the second portion of the first conductive layer. The method further includes forming an NVM dielectric layer over the first conductive layer in the NVM region and the non-NVM region. The method further includes patterning the NVM dielectric layer to form a first portion of the NVM dielectric layer in the NVM region over the first portion of the first conductive layer and a second portion of the NVM dielectric layer in the non-NVM region over the second portion of the first conductive layer, wherein the first portion of the NVM dielectric layer is physically separate from the second portion of the NVM dielectric layer. The method further includes forming a second conductive layer over the NVM dielectric layer in the NVM region and the non-NVM region. The method further includes forming a patterned masking layer over the second conductive layer in at least the NVM region to define at least one NVM gate stack in the NVM region. The method further includes etching the second conductive layer in the NVM region using the patterned masking layer and simultaneously etching the second conductive layer in the non-NVM region. The method further includes etching the NVM dielectric layer in the NVM region using the patterned masking layer and simultaneously etching the NVM dielectric layer in the non-NVM region. The method further includes etching the first conductive layer in the NVM region using the patterned masking layer and simultaneously etching the first conductive layer in the non-NVM region. The method may have a further characterization by which the step of patterning the first conductive layer is performed such that the second portion of the first conductive layer is formed over a tiling feature. The method may have a further characterization by which the step of forming the patterned masking layer over the second conductive layer is performed such that it is formed over the second conductive layer in the non-NVM region and further defines a dummy feature in the non-NVM region. The method may have a further characterization by which the second conductive layer overlaps an edge of the second portion of the first conductive layer, and wherein the patterned masking layer defines the dummy feature over the second conductive layer in an area of the non-NVM region which does not include the second portion of the first conductive layer between the second conductive layer and the substrate. The method may have a further characterization by which after the steps of etching, a resulting dummy feature corresponding to the dummy feature defined by the patterned masking layer comprises a remaining portion of the NVM dielectric layer over the substrate and a remaining portion of the second conductive layer over the remaining portion of the NVM dielectric layer, wherein the resulting dummy feature does not include any remaining portion of the first conductive layer. The method may have a further characterization by which after the steps of etching, a resulting dummy feature corresponding to the dummy feature defined by the patterned masking layer comprises a remaining portion of the first conductive layer over the semiconductor substrate, a remaining portion of the NVM dielectric layer over the remaining portion of the first conductive layer, and a remaining portion of the second conductive layer over the remaining portion of the NVM dielectric layer. The method may have a further characterization by which after the steps of etching, removing the remaining portion of the second conductive layer from the resulting dummy feature. The method may have a further characterization by which after the steps of etching, the resulting dummy feature defined by the patterned masking layer comprises a remaining portion of the NVM dielectric layer. The method may further comprise prior to forming the first conductive layer, forming a gate dielectric layer over the semiconductor substrate in the NVM region and the non-NVM region, wherein the first conductive layer is formed over the gate dielectric layer. The method may have a further characterization by which the NVM dielectric layer comprises a first oxide layer, a nitride layer over the first oxide layer, and a second oxide layer over the nitride layer.

Also disclosed is a method for forming a gate stack of a non-volatile memory (NVM) over a semiconductor substrate having an NVM region and a non-NVM region which does not overlap the NVM region. The method includes forming a floating gate layer over the semiconductor substrate in the NVM region and the non-NVM region. The method further includes patterning the floating gate layer to form a first portion of the floating gate layer in the NVM region and a second portion of the floating gate layer in the non-NVM region, wherein the first portion of the floating gate layer is physically separate from the second portion of the floating gate layer. The method further includes forming an NVM dielectric layer over the floating gate layer in the NVM region and the non-NVM region. The method further includes patterning the NVM dielectric layer to form a first portion of the NVM dielectric layer in the NVM region over the first portion of the floating gate layer and a second portion of the NVM dielectric layer in the non-NVM region over the second portion of the floating gate layer, wherein the first portion of the NVM dielectric layer is physically separate from the second portion of the NVM dielectric layer. The method further includes forming a control gate layer over the NVM dielectric layer in the NVM region and the non-NVM region. The method further includes forming a patterned masking layer over the control gate layer in the NVM region and in the non-NVM region, wherein a first portion of the patterned masking layer defines at least one NVM gate stack in the NVM region and a second portion of the patterned masking layer defines a dummy feature in the non-NVM region. The method further includes simultaneously etching the control gate layer in the NVM region and the non-NVM region using the patterned masking layer. The method further includes simultaneously etching the NVM dielectric layer in the NVM region and the non-NVM region using the patterned masking layer. The method further includes simultaneously etching the floating gate layer in the NVM region and the non-NVM region using the patterned masking layer. The method may have a further characterization by which the step of forming the control gate layer is performed such that it overlaps an edge of the second portion of the floating gate layer, and wherein the second portion of the patterned masking layer defines the dummy feature over the control gate layer in an area of the non-NVM region which does not include the second portion of the floating gate layer between the control gate layer and the semiconductor substrate. The method may have a further characterization by which after the steps of simultaneously etching, a resulting dummy feature corresponding to the dummy feature defined by the second portion of the patterned masking layer comprises a remaining portion of the NVM dielectric layer over the semiconductor substrate and a remaining portion of the control gate layer over the remaining portion of the NVM dielectric layer, wherein the resulting dummy feature does not include any remaining portion of the floating gate layer. The method may have a further characterization by which after the steps of etching, a resulting dummy feature corresponding to the dummy feature defined by the second portion of the patterned masking layer comprises a remaining portion of the floating gate layer over the substrate, a remaining portion of the NVM dielectric layer over the remaining portion of the floating gate layer, and a remaining portion of the control gate layer over the remaining portion of the NVM dielectric layer. The method may further comprise after the steps of simultaneously etching, removing the remaining portion of the control gate layer from the resulting dummy feature. The method may have a further characterization by which after the steps of simultaneously etching, a resulting dummy feature corresponding to the dummy feature defined by the second portion of the patterned masking layer comprises a remaining portion of the NVM dielectric layer and one of a remaining portion of the control gate layer or a remaining portion of a select gate layer.

Disclosed also is a method for forming a gate stack of a non-volatile memory (NVM) over a semiconductor substrate having an NVM region and a non-NVM region which does not overlap the NVM region. The method includes forming a select gate layer over the semiconductor substrate in the NVM region and the non-NVM region, wherein the select gate layer is formed over a tiling feature. The method further includes simultaneously etching the select gate layer in the NVM region and the select gate layer in the non-NVM region, wherein the forming the select gate layer in the non-NVM region exposes the tiling feature and the forming the select gate layer in the NVM region results in a first portion of the select gate layer remaining in the NVM region. The method further includes forming a charge storage layer over the semiconductor substrate in the NVM region and the non-NVM region, wherein the charge storage layer is formed over the first portion of the select gate layer. The method further includes forming a control gate layer over the charge storage layer in the NVM region and the non-NVM region. The method further includes simultaneously etching the control gate layer in the NVM region and the non-NVM region. The method further includes simultaneously etching the charge storage layer in the NVM region and the non-NVM region, wherein the forming the charge storage layer and the control gate layer in the non-NVM region exposes the tiling feature and the forming the select gate layer in the NVM region results in a portion of the charge storage layer over the first portion of the select gate layer and overlapping a sidewall of the first portion of the select gate layer and results in a portion of the control gate layer over the portion of the charge storage layer. The method further includes forming a split gate device using the first portion of the select gate layer, the portion of the charge storage layer, and the portion of the control gate layer. The method may have a further characterization by which the step of forming the select gate layer in the non-NVM region results in a second portion of the select gate layer remaining in the non-NVM region, wherein the second portion is further characterized as a dummy feature. The method may have a further characterization by which the steps of forming the charge storage layer and the control gate layer in the non-NVM region are performed such that a top surface of the dummy feature is exposed. The method may have a further characterization by which the dummy feature is formed over the tiling feature.

Although the invention is described herein with reference to specific embodiments, various modifications and changes can be made without departing from the scope of the present invention as set forth in the claims below. For example, different materials may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a gate stack of a non-volatile memory (NVM) over a semiconductor substrate having an NVM region and a non-NVM region which does not overlap the NVM region, the method comprising:
forming a select gate layer over the substrate in the NVM region and the non-NVM region;
simultaneously etching the select gate layer in the NVM region and the select gate layer in the non-NVM region, wherein the etching the select gate layer in the NVM region results in a first portion of the select gate layer remaining in the NVM region;
forming a charge storage layer over the substrate in the NVM region and the non-NVM region, wherein the charge storage layer is formed over the first portion of the select gate layer;
forming a control gate layer over the charge storage layer in the NVM region and the non-NVM region;
simultaneously etching the control gate layer in the NVM region and the non-NVM region;
simultaneously etching the charge storage layer in the NVM region and the non-NVM region, wherein the etching the select gate layer in the NVM region results in a portion of the charge storage layer over the first portion of the select gate layer and overlapping a sidewall of the first portion of the select gate layer and results in a portion of the control gate layer over the portion of the charge storage layer; and
forming a split gate device using the first portion of the select gate layer, the portion of the charge storage layer, and the portion of the control gate layer.

2. The method of claim 1, wherein the select gate layer in the non-NVM region is formed over a tiling feature.

3. The method of claim 1, wherein the select gate layer in the non-NVM region is formed over an active circuit feature.

4. The method of claim 1, wherein the step of etching the select gate layer in the non-NVM region results in a second portion of the select gate layer remaining in the non-NVM region.

5. The method of claim 4, wherein the second portion is further characterized as a dummy feature.

6. The method of claim 5, wherein, the steps of etching the charge storage layer and the control gate layer in the non-NVM region are performed such that a top surface of the dummy feature is exposed.

7. The method of claim 4, wherein the second portion is further characterized as an active circuit feature.

8. The method of claim 1, wherein the step of simultaneously etching the select gate layer in the NVM region and the select gate layer in the non-NVM region is performed such that the select gate is completely removed from the non-NVM region.

9. The method of claim 1, wherein the semiconductor substrate comprises a logic region, and wherein:
the step of forming the select gate layer is performed such that the select gate layer is formed over the substrate in the logic region,
the step of forming the charge storage layer is performed such that the charge storage layer is formed over the select gate layer in the logic region, and
the step of forming the control gate layer is performed such that the control gate layer is formed over the charge storage layer in the logic region.

10. The method of claim 9, wherein the step of simultaneous etching the select gate layer in the NVM region and the select gate layer in the non-NVM region does not etch the select gate layer in the logic region.

11. The method of claim 10, wherein:
the step of simultaneously etching the control gate layer is performed such that the control gate layer is removed from the logic region, and
the step of simultaneously etching the charge storage layer is performed such that the charge storage layer is removed from the logic region.

12. The method of claim 11, wherein after the step of simultaneously etching the charge storage layer, patterning the select gate layer in the logic region to form a logic device gate.

13. A method for forming a gate stack of a non-volatile memory (NVM) over a semiconductor substrate having an NVM region and a non-NVM region which does not overlap the NVM region, the method comprising:
forming a select gate layer over the substrate in the NVM region and the non-NVM region, wherein the select gate layer is formed over a tiling feature;
simultaneously etching the select gate layer in the NVM region and the select gate layer in the non-NVM region, wherein the etching the select gate layer in the non-NVM region exposes the tiling feature and the etching the select gate layer in the NVM region results in a first portion of the select gate layer remaining in the NVM region;
forming a charge storage layer over the substrate in the NVM region and the non-NVM region, wherein the charge storage layer is formed over the first portion of the select gate layer;
forming a control gate layer over the charge storage layer in the NVM region and the non-NVM region;
simultaneously etching the control gate layer in the NVM region and the non-NVM region;
simultaneously etching the charge storage layer in the NVM region and the non-NVM region, wherein the etching the charge storage layer and the control gate layer in the non-NVM region exposes the tiling feature and the etching the select gate layer in the NVM region results in a portion of the charge storage layer over the first portion of the select gate layer and overlapping a sidewall of the first portion of the select gate layer and results in a portion of the control gate layer over the portion of the charge storage layer; and
forming a split gate device using the first portion of the select gate layer, the portion of the charge storage layer, and the portion of the control gate layer.

14. The method of claim 13, wherein the step of etching the select gate layer in the non-NVM region results in a second portion of the select gate layer remaining in the non-NVM region, wherein the second portion is further characterized as a dummy feature.

15. The method of claim 14, wherein, the steps of etching the charge storage layer and the control gate layer in the non-NVM region are performed such that a top surface of the dummy feature is exposed.

16. The method of claim 14, wherein the dummy feature is formed over the tiling feature.

17. A method for forming a gate stack of a non-volatile memory (NVM) over a semiconductor substrate having an NVM region, a non-NVM region which does not overlap the NVM region, and a logic region, the method comprising:
forming a select gate layer over the substrate in the NVM region, the non-NVM region, and the logic region;
simultaneously etching the select gate layer in the NVM region and the select gate layer in the non-NVM region, wherein the etching the select gate layer in the NVM region results in a first portion of the select gate layer remaining in the NVM region;

forming a charge storage layer over the substrate in the NVM region, the non-NVM region, and the logic region, wherein the charge storage layer is formed over the first portion of the select gate layer;

forming a control gate layer over the charge storage layer in the NVM region, the non-NVM region, and the logic region;

simultaneously etching the control gate layer in the NVM region, the non-NVM region, and the logic region;

simultaneously etching the charge storage layer in the NVM region, the non-NVM region, and the logic region, wherein the etching the select gate layer in the NVM region results in a portion of the charge storage layer over the first portion of the select gate layer and overlapping a sidewall of the first portion of the select gate layer and results in a portion of the control gate layer over the portion of the charge storage layer;

forming a split gate device using the first portion of the select gate layer, the portion of the charge storage layer, and the portion of the control gate layer; and forming a logic device gate using the select gate layer in the logic region.

18. The method of claim 17, wherein the step of forming the logic device gate comprises:

after the step of simultaneously etching the charge storage layer, patterning the select gate layer in the logic region to form the logic device gate.

19. The method of claim 17, wherein the step of simultaneous etching the select gate layer in the NVM region and the select gate layer in the non-NVM region does not etch the select gate layer in the logic region.

20. The method of claim 17, wherein the step of forming the select gate layer over the substrate in the non-NVM region is performed such that the select gate layer is formed over an active circuit feature in the non-NVM region.

* * * * *